United States Patent
Johnson et al.

(10) Patent No.: US 12,342,476 B2
(45) Date of Patent: Jun. 24, 2025

(54) WIRELESS REMOTE CONTROL AND MOUNT SYSTEM

(71) Applicant: ABL IP Holding, LLC, Conyers, GA (US)

(72) Inventors: John R. Johnson, Flowery Branch, GA (US); Michael Crist, Atlanta, GA (US); John Peter Roquemore, Suwanee, GA (US)

(73) Assignee: ABL IP Holding, LLC, Atlanta, GA (US)

( * ) Notice: Subject to any disclaimer, the term of this patent is extended or adjusted under 35 U.S.C. 154(b) by 316 days.

(21) Appl. No.: 17/931,405

(22) Filed: Sep. 12, 2022

(65) Prior Publication Data

US 2024/0090141 A1    Mar. 14, 2024

(51) Int. Cl.
| | |
|---|---|
| *H05K 5/02* | (2006.01) |
| *G08B 7/06* | (2006.01) |
| *H01H 13/14* | (2006.01) |
| *H05K 5/00* | (2006.01) |
| *H05K 5/10* | (2025.01) |

(52) U.S. Cl.
CPC ............ *H05K 5/0017* (2013.01); *G08B 7/06* (2013.01); *H01H 13/14* (2013.01); *H05K 5/0204* (2013.01); *H05K 5/10* (2025.01)

(58) Field of Classification Search
CPC .. H05K 5/0204; H05K 5/0004; H05K 5/0217; H05K 5/0017
USPC ......................... 361/752, 728, 730, 796, 800
See application file for complete search history.

(56) References Cited

U.S. PATENT DOCUMENTS

| | | | |
|---|---|---|---|
| 8,330,638 B2 | 12/2012 | Altonen et al. | |
| 9,024,800 B2 | 5/2015 | Altonen et al. | |
| 9,384,657 B2 | 7/2016 | Mullet et al. | |
| 9,699,870 B2 | 7/2017 | Spira | |
| 9,800,034 B2 | 10/2017 | Johnson et al. | |
| 9,978,547 B1 | 5/2018 | Wisniewski et al. | |
| 10,066,820 B2 | 9/2018 | Johnson | |
| 10,386,891 B2 | 8/2019 | Allen et al. | |
| 2019/0287743 A1* | 9/2019 | Wisniewski | H01H 13/83 |
| 2019/0341760 A1* | 11/2019 | Okura | H02G 15/10 |
| 2022/0005656 A1* | 1/2022 | Shimoyama | H05K 5/0017 |

* cited by examiner

*Primary Examiner* — Hung S. Bui
(74) *Attorney, Agent, or Firm* — Grossman, Tucker, Perreault & Pfleger PLLC

(57) ABSTRACT

A wireless remote controller includes a housing including front and rear enclosures defining a PCB cavity, a PCB disposed within the PCB cavity, a switch, communication circuitry to generate wireless signals, and a button to actuate the switch. The button includes a button body having a button portion and first and second button sidewalls having a retaining finger to engage the support board. The button width is substantially the same as the housing width. The wireless remote controller may include a mounting cavity formed in a rear surface of the housing which includes first and second converging cavity sidewall extending from a base. A mounting plate removably secures the wireless remote controller to a wall and includes first and second converging mount sidewalls each including a rail. The cavity sidewalls and the mount sidewalls include a first and second rail and a first and second channel.

20 Claims, 23 Drawing Sheets

WIRELESS REMOTE CONTROL AND MOUNT SYSTEM

TECHNICAL FIELD

This specification relates to wireless remote controls and mounting systems, and more particularly, to wireless remote controls having increased button size and mounting systems that reduce insertion height.

BACKGROUND INFORMATION

The following is not an admission that anything discussed below is part of the prior art or part of the common general knowledge of a person skilled in the art.

Wireless controllers are used to control one or more parameters of a variety of electrical devices such as, but not limited to, fans, lights, or the like. Wireless controllers are becoming particularly desired due to the reduction in installation costs since they can eliminate the need to run wires between traditional switches and controllers. In some applications, it is desirable for the wireless controller to have the size and/or appearance of a traditional wall mounted switch. Known wireless controllers, however, typically have relatively small buttons, thereby making them more difficult to use. In addition, some wireless controllers are configured to be removably secured to a support surface (such as a wall or the like). Unfortunately, the known wireless controllers utilize parallel mounting rails that require an installation dimension equal to the product length plus the length of the mounting plate, thereby limiting installation options near adjacent device (e.g., fire alarms, room placards, lips on office cube dividers, etc.).

BRIEF DESCRIPTION OF THE DRAWINGS

These and other features advantages will be better understood by reading the following detailed description, taken together with the drawings wherein.

Figure 1:
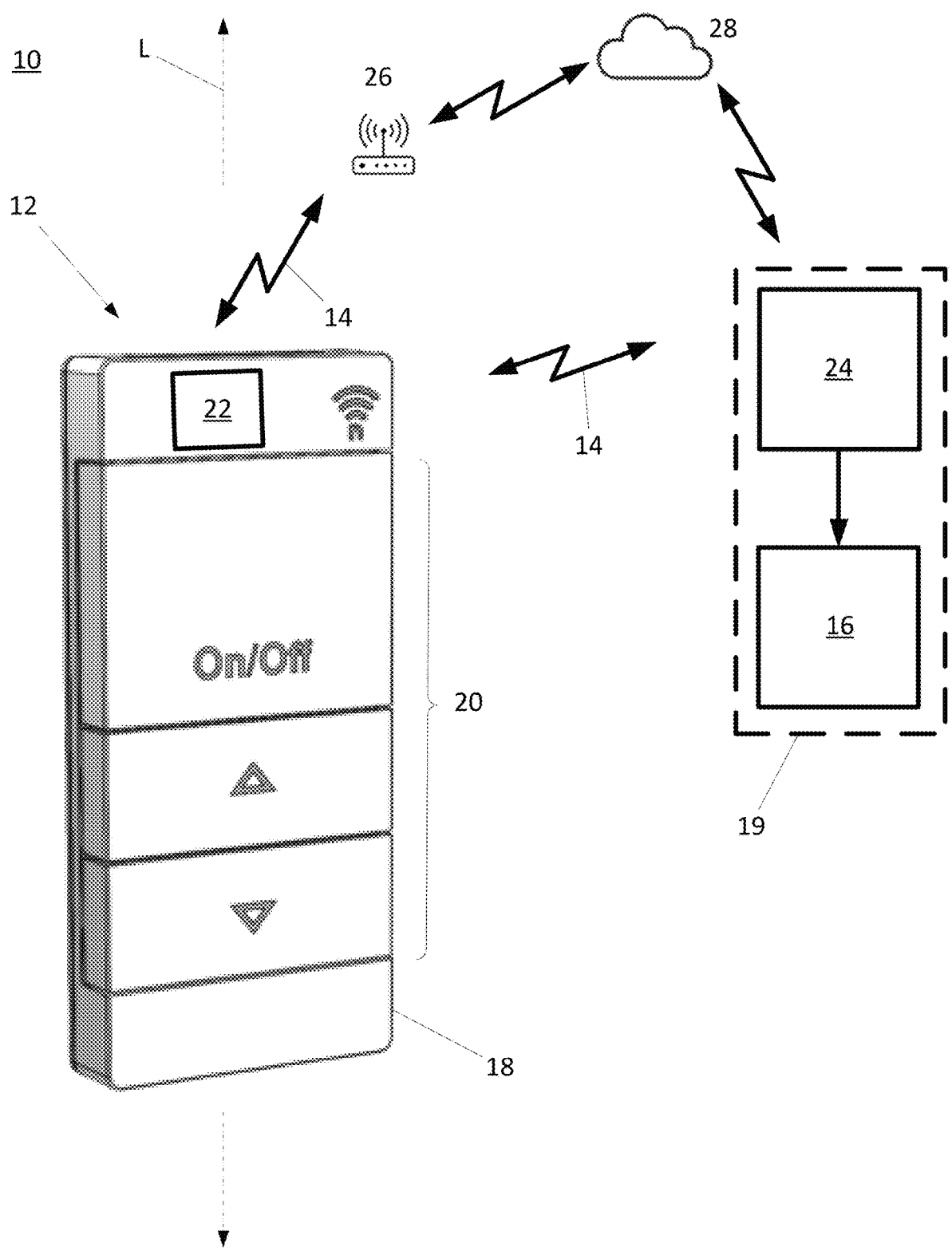
FIG. 1 generally illustrates one example of a wireless control system, consistent with the present disclosure.

The drawings included herewith are for illustrating various examples of articles, methods, and apparatuses of the teaching of the present specification and are not intended to limit the scope of what is taught in any way.

DETAILED DESCRIPTION

Various apparatuses or processes will be described below to provide an example of an embodiment of each claimed invention. No embodiment described below limits any claimed invention and any claimed invention may cover processes or apparatuses that differ from those described below. The claimed inventions are not limited to apparatuses or processes having all of the features of any one apparatus or process described below or to features common to multiple or all of the apparatuses described below. It is possible that an apparatus or process described below is not an embodiment of any claimed invention. Any invention disclosed in an apparatus or process described below that is not claimed in this document may be the subject matter of another protective instrument, for example, a continuing patent application, and the applicants, inventors or owners do not intend to abandon, disclaim or dedicate to the public any such invention by its disclosure in this document.

By way of a general overview, one aspect of the present disclosure features a wireless remote controller including a housing, a printed circuit board (PCB), and a button. The housing includes a front enclosure and a rear enclosure defining a PCB cavity. The PCB is configured to be disposed at least partially within the PCB cavity and includes a support board, one or more switches configured to generate a command upon actuation, and communication circuitry configured to generate a wireless signal representative of the command. The button is configured to actuate the switch upon depressing the button inwardly towards the PCB. The button includes a button body having at least one button portion and a first and a second button sidewall extending from the button body. Each button sidewall includes one or more retaining fingers configured to receive and engage a backside of the support board of the PCB. A width of the button is substantially the same as a width of the housing.

According to another aspect, the present disclosure features a wireless control system including a wireless remote controller and a mounting plate. The wireless remote controller comprises a housing including a PCB cavity and a mounting cavity formed in at least a portion of a rear surface of the housing. The mounting cavity has an opening, a base, and a first and a second converging cavity sidewall extending from the base. The mounting plate is configured to removably secure the wireless remote controller to a support surface and includes a first and second converging mount sidewalls each including a rail. The cavity sidewalls and the mount sidewalls include a first and a second rail and a first and a second channel. The converge of the second mount sidewalls corresponds to the converge of the cavity sidewalls such that the rails slidably fit within and engage the channels to retain the wireless remote controller to the mounting plate. The wireless remote controller and mounting plate may reduce the insertion height needed to insert and/or remove the wireless remote controller from the mounting plate.

Turning now to FIG. 1, one example of a wireless control system 10 is generally illustrated. The wireless control system 10 may include one or more wireless remote controllers 12 configured to transmit and/or receive one or more wireless signals 14 with one or more electronic devices 16 (such as, but not limited to, lights, fans, televisions, audio equipment, projectors, window blinds, thermostats, or the like) to control one or more functions of the electronic devices 16. The wireless remote controller 12 includes a housing 18, one or more buttons 20 coupled to the housing 18, and communication circuitry 22 at least partially disposed within the housing 18. The buttons 20 are configured to cause one or more commands to be generated when activated by a user. The commands may be configured to adjust any parameter and/or function of the electronic device 16 such as, but not limited to, turning the electronic device 16 on or off, adjusting volume up/down, adjusting fan speed, etc. The communication circuitry 22 is configured to generate one or more wireless signals 14 which include data corresponding to the generated command.

The communication circuitry 22 of the wireless remote controller 12 may wirelessly communicate with (transmit to and/or receive electronic communication from) communication circuitry 24 associated with the electronic devices 16 using any known wireless communication standard and protocol (e.g., Wi-Fi, Bluetooth, Zigbee, infrared (IR), radio frequency (RF), cellular, or the like). As such, it should be understood that the communication circuitry 22 and/or communication circuitry 24 may include either one-way communication elements (e.g., transmitter) or two-way communication elements (e.g., transmitter and/or receiver, such as a transceiver).

The communication circuitry 22 of the wireless remote controller 12 may be at least partially contained within the housing 18. The communication circuitry 24 of the electronic device 16 may be integral with the electronic device 16 (e.g., at least partially contained within the housing 19 of the electronic device 16) or separate from the electronic device 16. In one example, the communication circuitry 24 of the electronic device 16 may be integral with the housing 19 of the electronic device 16 and the communication circuitry 22 of the wireless remote controller 12 may communicate directly with the electronic device 16.

Alternatively, the communication circuitry 24 of the electronic device 16 may be outside (e.g., remote) from the housing 19 of the electronic device 16 and the communication circuitry 22 of the wireless remote controller 12 may communicate indirectly with the electronic device 16. For example, the communication circuitry 22 of the wireless remote controller 12 may communicate using Wi-Fi to a modem 26 which in turn connects the wireless remote controller 12 to local server and/or an Internet-based application software as a service (such as a building management system, generally represented by a cloud 28), which in turn is accessed by the communication circuitry 24 associated with the electronic device 16. The cloud 28 may be configured to interpret the wireless signals 14, identify the particular electronic device 16 to be controlled, and generate a command that is understood by the communication circuitry 24 of the electronic device 16. This may be particularly useful in applications where the communication circuitry 24 is associated with multiple wireless remote controllers 12 and/or multiple electronic devices 16 as well as applications where the wireless remote controllers 12 and electronic devices 16 are distributed over large distances.

Figure 2:
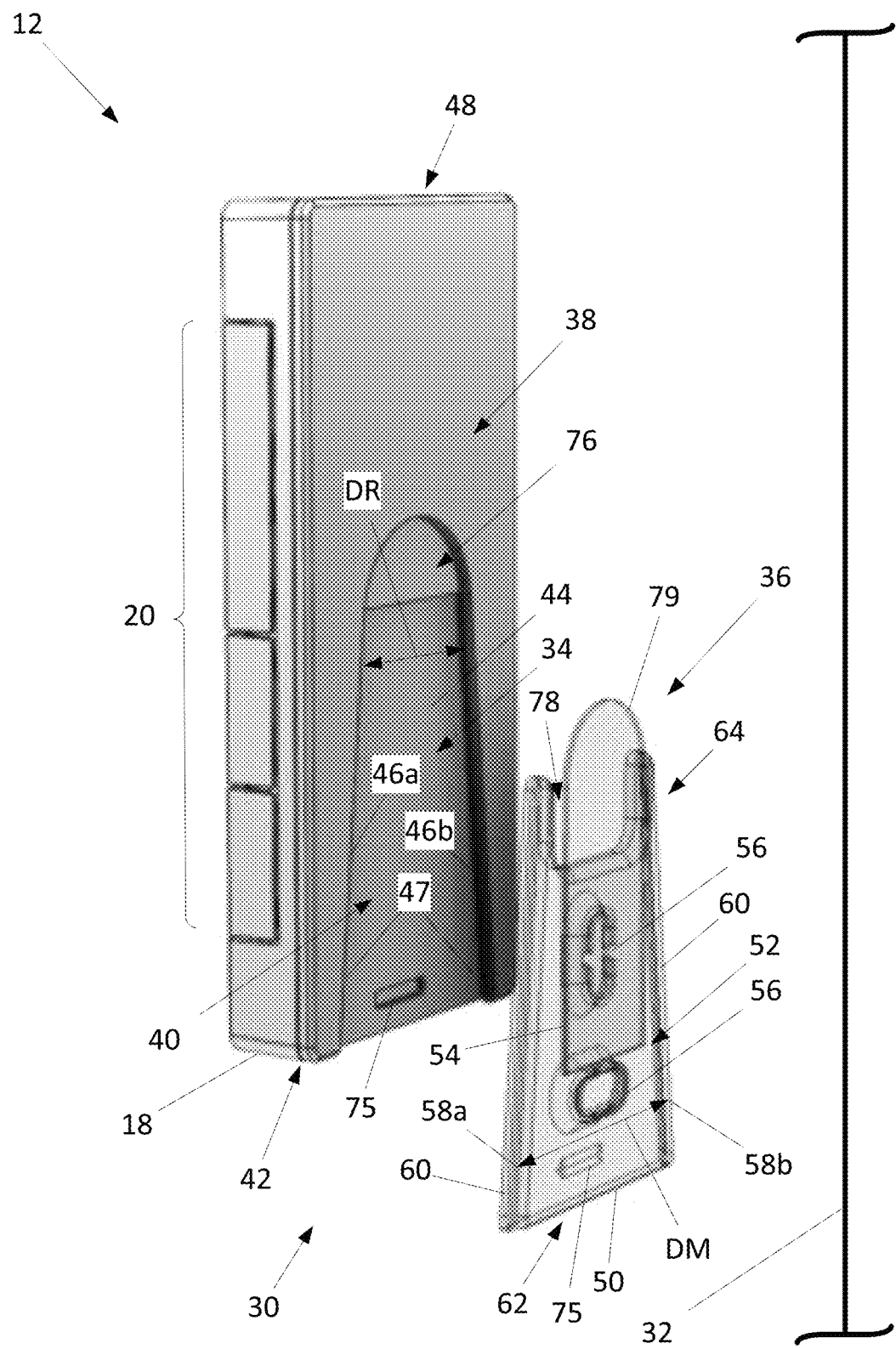
FIG. 2 generally illustrates one example of a mounting system in an unassembled state (FIG. 2)
Figure 3:
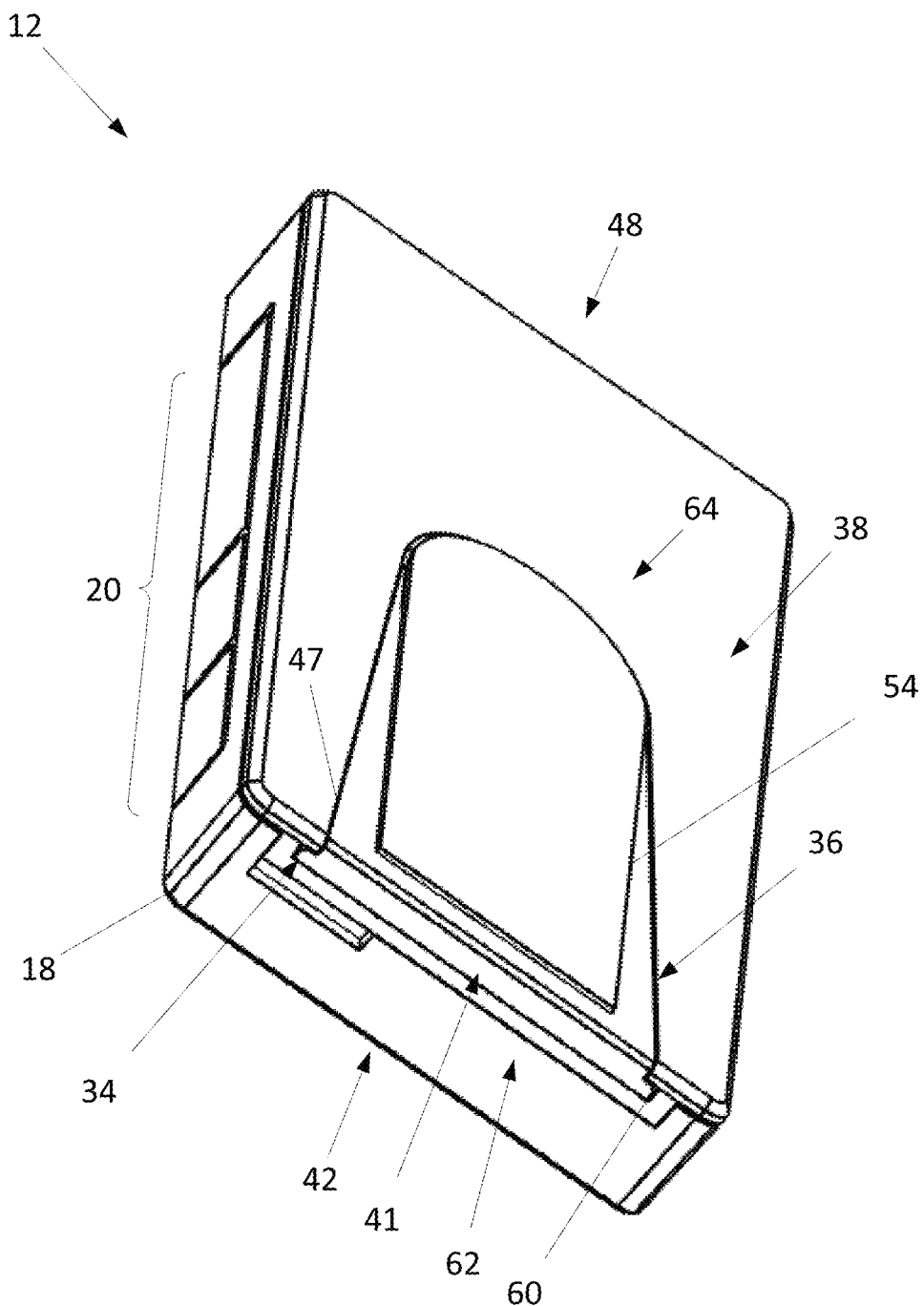
FIG. 3 generally illustrates the mounting system in an assembled state.

Turning now to FIGS. 2 and 3, one example of a mounting system 30 is generally illustrated in an unassembled state (FIG. 2) and in an assembled state (FIG. 3). The mounting system 30 is configured to removably secure the wireless remote controller 12 to a support surface 32 (such as, but not limited to, a wall or the like). In the illustrated example, the mounting system 30 includes a mounting recess 34 formed by the housing 18 of the wireless remote controller 12 and a mounting plate 36 configured to be secured to the support surface 32.

Figure 4:
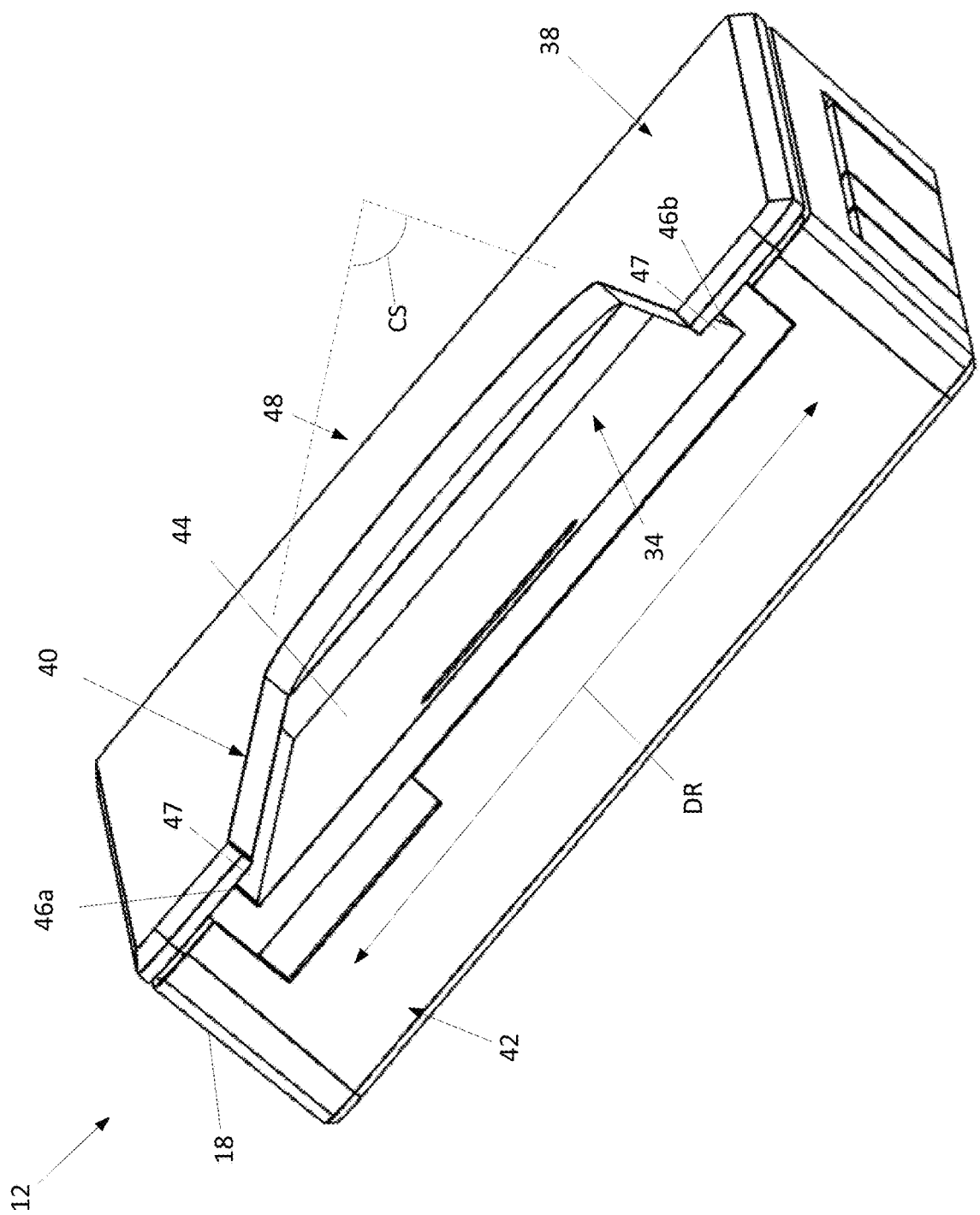
FIG. 4 generally illustrates one example of a mounting cavity, consistent with the present disclosure.
Figure 5A:
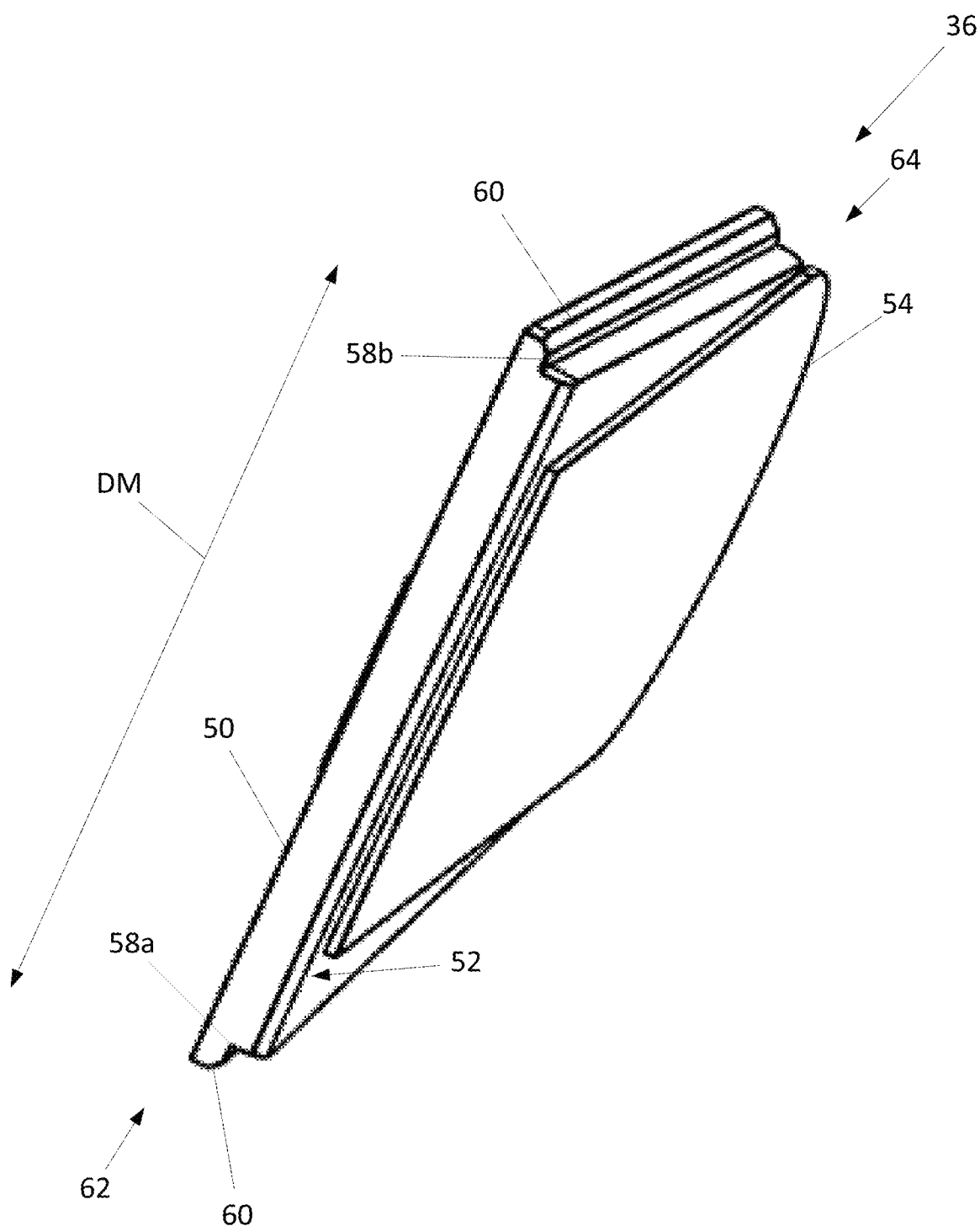
FIG. 5A generally illustrates one example of a mounting plate, consistent with the present disclosure.
Figure 5B:
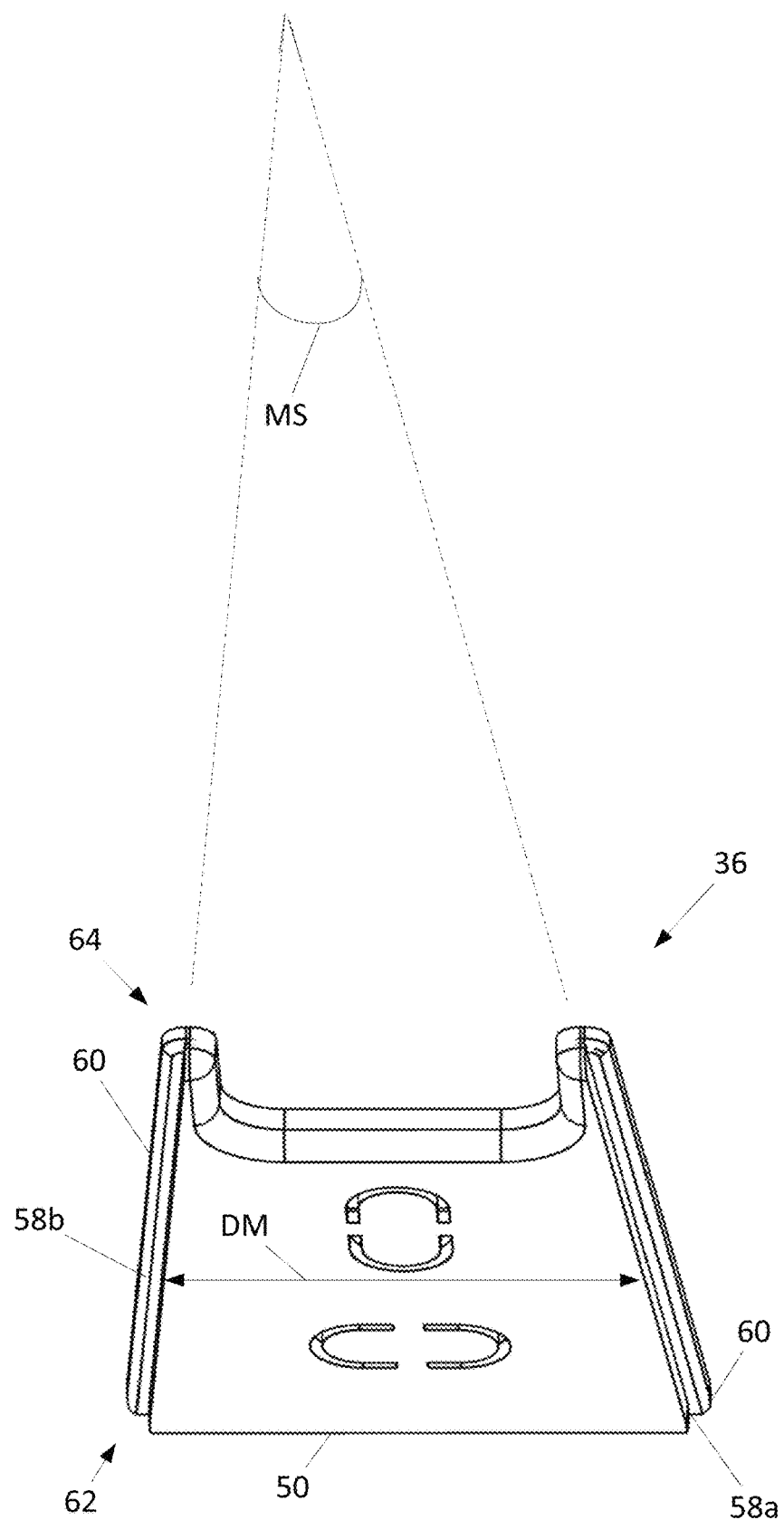
FIG. 5B generally illustrates another view of the mounting plate of FIG. 5A, consistent with the present disclosure.

The mounting cavity 34 (FIGS. 2-4) may be formed in at least a portion of the rear surface 38 of the housing 18 and is configured to at least partially receive the mounting plate 36 to removably secure the wireless remote controller 12 to the mounting plate 36. In particular, the mounting cavity 34 may include an opening 40, a base 44, and a first and a second tapered or converging sidewall 46a, 46b extending from the base 44. The opening 40 is defined at least partially by the rear surface 38 of the housing 18 and is configured to receive at least a portion of the mounting plate 36. In the illustrated, a portion 41 of the opening 40 is disposed proximate to the bottom 42 of the housing 18; however, it should be appreciated that the opening 40 may be formed entirely from the rear surface 38 of the housing 18.

The first and second tapered or converging sidewalls 46a, 46b may have a shape (e.g., but not limited to, a generally trapezoidal shape) in which the separation distance DR of the opening 40 (e.g., the distance between the cavity sidewalls 46a, 46b) decreases from the bottom 42 of the housing 18 to the top 48 of the housing 18 (e.g., the separation distance DR proximate the bottom 42 of the housing 18 is larger than the separation distance DR proximate the top 48 of the housing 18). The first and second cavity sidewalls 46a, 46b each include a channel 47 configured to slidably engage with the mounting plate 36 as discussed below. The cavity sidewalls 46a, 46b may have a non-parallel configuration. In at least one embodiment, projections of the cavity sidewalls 46a, 46b may intersect at an angle CS which is between about 5 to about 20 degrees, for example, about 9.5 degrees.

The mounting plate 36 (FIGS. 2, 3, 5A, 5B) is configured to be secured to the support surface 32 in any manner known to those skilled int the art. For example, the mounting plate 36 may include a body 50 having a rear surface 52 configured to be secured to a double-sided adhesive 54. Alternatively (or additionally), the body 50 may include one or more apertures 56 configured to receive a fastener (such as screws, bolts, rivets, etc.).

The body 50 of the mounting plate 36 includes a first and second tapered or converging mount sidewalls 58a, 58b each including a rail 60. The first and second mount sidewalls 58a, 58b of the mounting plate 36 may have a shape (e.g., but not limited to, a generally trapezoidal shape) in which the separation distance DM of the between the sidewalls 58a, 58b decreases from the bottom 62 of the body 50 to the top 64 of the body 50 (e.g., the separation distance DM proximate the bottom 62 of the body 50 is larger than the separation distance DM proximate the top 64 of the body 50). The mount sidewalls 58a, 58b may have a non-parallel configuration. In at least one embodiment, projections of the mount sidewalls 58a, 58b (FIG. 5B) may intersect at an angle MS which is between about 5 to about 20 degrees, for example, about 9.5 degrees.

The taper or convergence of the mount sidewalls 58a, 58b may correspond to the taper or converge of the first and second cavity sidewalls 46a, 46b such that the rails 60 of the mount sidewalls 58a, 58b slidably fit within and engage the channels 47 of the cavity first and second cavity sidewalls 46a, 46b, respectively, to retain the wireless remote controller 12 to the mounting plate 36. In at least one example, the channels 47 and rails 60 may form tongue and groove configuration, a T-slot configuration, a V-slot configuration, an L-slot configuration, or the like.

Figure 6:
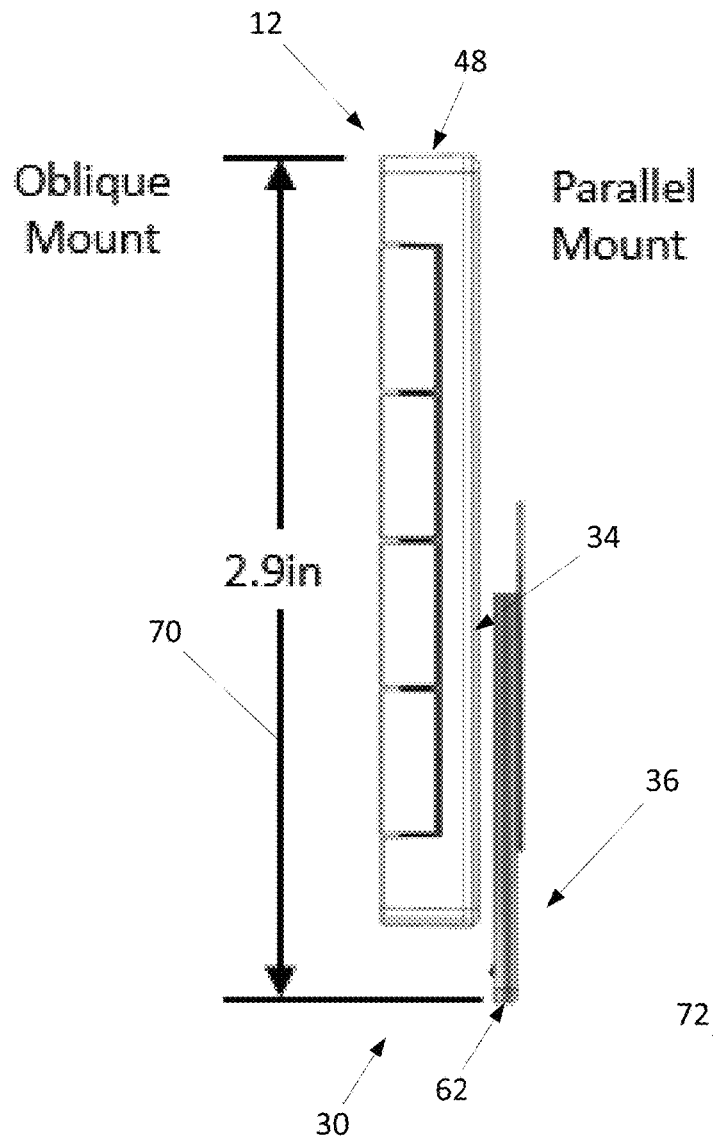
FIG. 6 generally illustrates the mounting height of a mounting system, consistent with the present disclosure.
Figure 7:
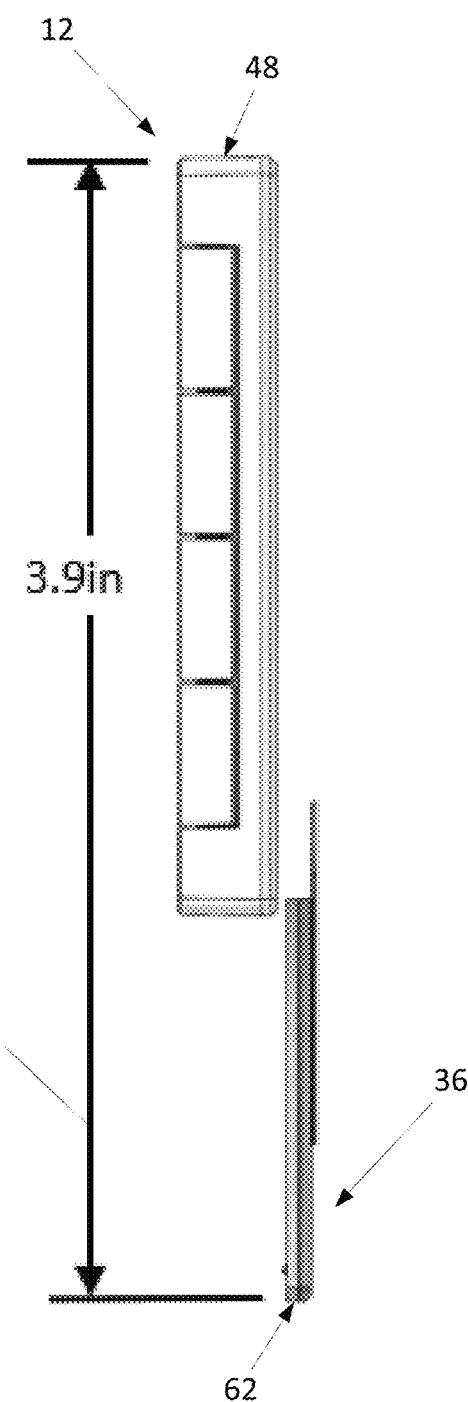
FIG. 7 generally illustrates the mounting height of a mounting system having a parallel configuration.

The taper or convergence of the first and second cavity sidewalls 46a, 46b and the mount sidewalls 58a, 58b advantageously decreases the mounting height when securing the wireless remote controller 12 to the support surface 32. In particular, FIG. 6 generally illustrates one example of the mounting system 30 in which the first and second cavity sidewalls 46a, 46b and the mount sidewalls 58a, 58b taper or converge and FIG. 7 generally illustrates one example of a mounting system in which the first and second cavity sidewalls 46a, 46b and the mount sidewalls 58a, 58b are generally parallel to each other. As can be seen, the minimum mounting distance 70 between the bottom 62 of the mounting plate 36 and the top 48 of the wireless remote controller 12 required to secure the wireless remote controller 12 to the mounting plate 36 is smaller when the first and second cavity sidewalls 46a, 46b and the mount sidewalls 58a, 58b taper or converge (FIG. 6) compared to the minimum mounting distance 72 when the first and second cavity sidewalls 46a, 46b and the mount sidewalls 58a, 58b are generally parallel to each other (FIG. 7). In the case where the first and second cavity sidewalls 46a, 46b are parallel (FIG. 7), the entire first and second cavity sidewalls 46a, 46b of the wireless remote controller 12 must be above the mount sidewalls 58a, 58b of the mount 36 in order to allow the mount sidewalls 58a, 58b of the mounting plate 36 to be received in the mounting cavity 34 of the wireless remote controller 12. In contrast, when the first and second cavity sidewalls 46a, 46b are taper or converge (FIG. 6), the wireless remote controller 12 only needs to be offset relative to the mounting plate 36 such that the minimum separation distance DR of the cavity sidewalls 46a, 46b (i.e., the separation distance DR of the cavity sidewalls 46a, 46b proximate the top 48 of the wireless remote controller 12) is equal to or slightly less than the separation distance DM of the mount sidewalls 58a, 58b.

The reduction in the mounting distance or height 70 of the converging or tapering sidewalls 46a, 46b, 58a, 58b provides more flexibility when securing the wireless remote controller 12 to the support surface 32 (e.g., allows the wireless remote controller 12 to be mounted closer to fire alarms, room placard, lips on office cube dividers, etc.). Moreover, the tapering or converging sidewalls 46a, 46, 58a, 58b makes it easier to a user to align the wireless remote controller 12 (i.e., the mounting cavity 34) relative to the mounting plate 36 (e.g., the mount sidewalls 58a, 58b). In particular, the tapering or converging nature of the sidewalls 46a, 46, 58a, 58b tends to self-align the wireless remote controller 12 relative to the mounting plate 36. In contrast, in the case of parallel sidewalls 46a, 46, 58a, 58b, the sidewalls must be precisely aligned in order to fit together.

The mounting system 30 may optionally include one or more mounting detents and recesses 75. In particular, the mounting cavity 34 may include a detent recess configured to receive a resiliently deformable detent formed on the mounting plate 36 (e.g., the body 50). The mounting detents and recesses 75 may provide an audible noise or tactile feedback to alert the user that the wireless remote controller 12 has been secured to the mounting plate 36. In addition (or alternatively), the mounting detents and recesses 75 may provide a retaining force that aids in securing the wireless remote controller 12 to the mounting plate 36, thereby resisting inadvertent or accidental removal of the wireless remote controller 12 from the mounting plate 36. Of course, the mounting cavity 34 may include the resiliently deformable detent and the mounting plate 36 may include the detent recess.

The mounting system 30 may optionally include a tab recess 76 and tab notch 78 (best seen in FIG. 2) configured to provide space for the removal tab 79 associated with the double-sided adhesive 54. The tab recess 76 may be formed by a portion of the mounting cavity 34 and the tab notch 78 may be formed by a portion of the mounting plate 36 (e.g., but not limited to, the top of the mounting cavity 34 and top of the mounting plate 36). The space provided by the tab recess 76 and tab notch 78 may allow the wireless remote controller 12 to fit flush/evenly with the mounting plates 36 when secured thereto and to provide access to the removal tab 79 associated with the double-sided adhesive 54 for removal of the mounting plates 36 and the double-sided adhesive 54 from the support surface 32.

It should be appreciated that while the wireless remote controller 12 is shown having a mounting cavity 34 and the mounting plate 36 is shown having mount sidewalls 58a, 58b configured to be received in the mounting cavity 34, the mounting plate 36 may alternatively have the mounting cavity 34 and the wireless remote controller 12 may have mount sidewalls 58a, 58b configured to be received in the mounting cavity 34 of the mounting plate 36.

Figure 8:
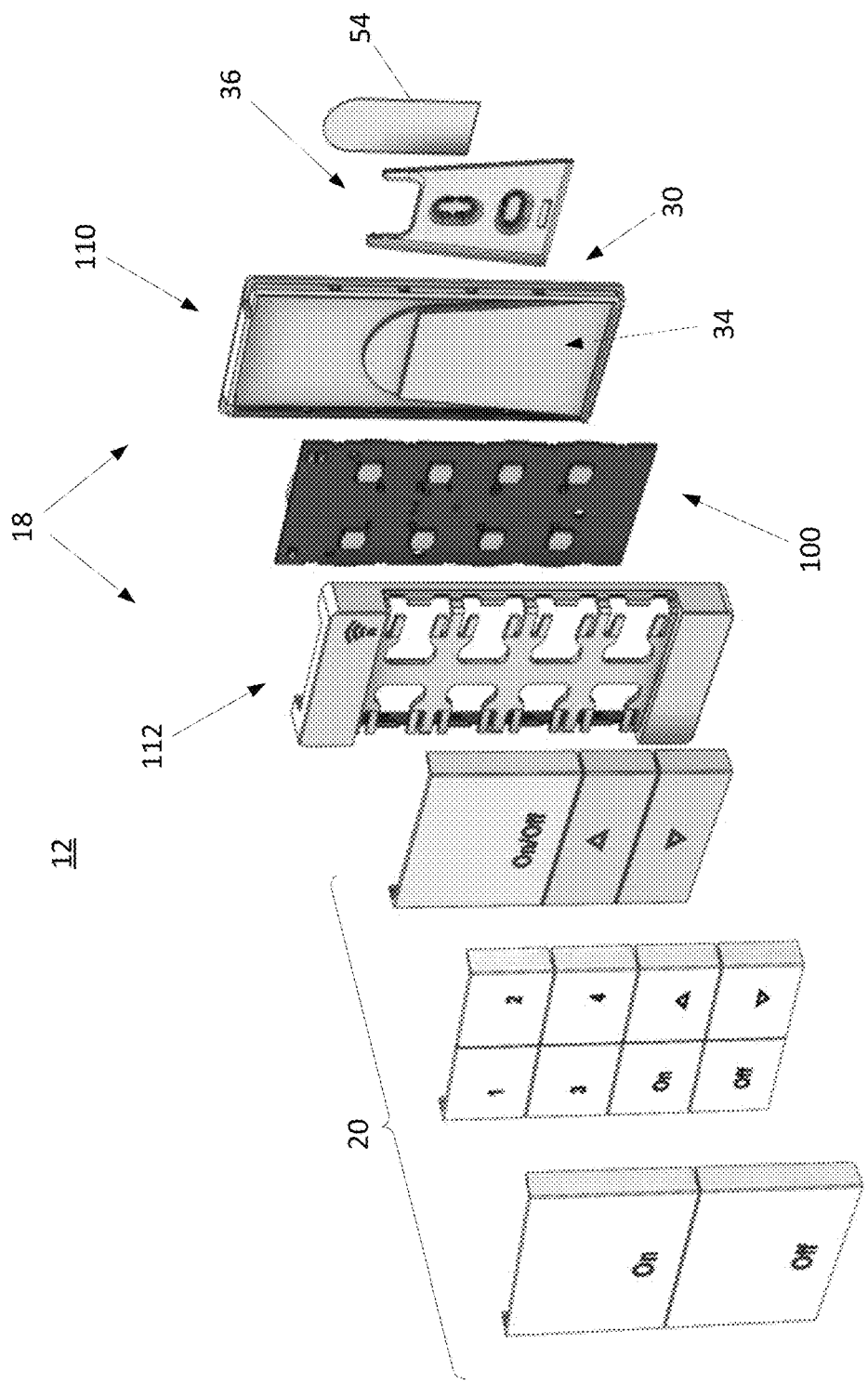
FIG. 8 is an exploded view of one example of a wireless control system, consistent with the present disclosure.
Figure 9:
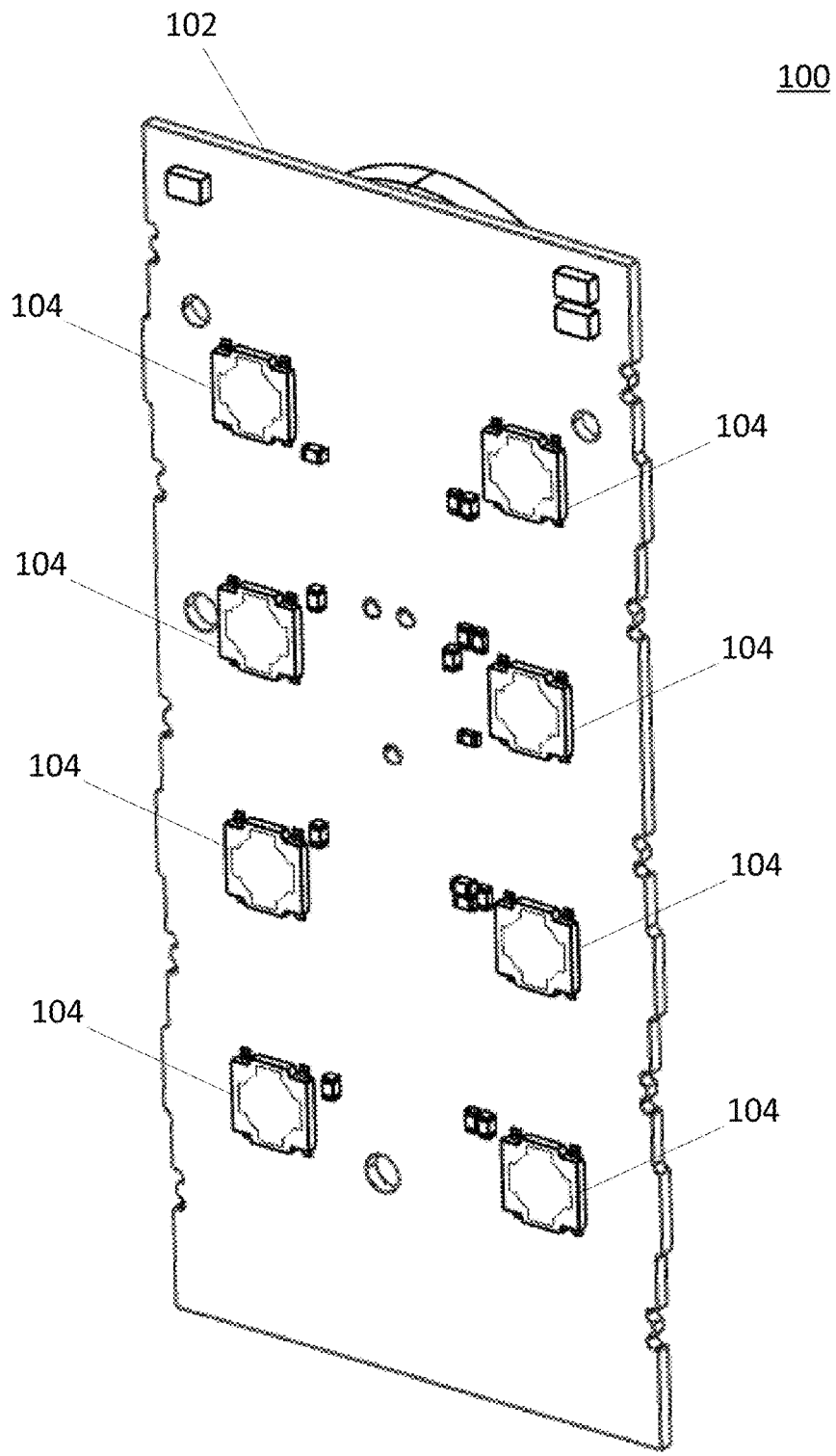
FIGS. 9 and 10 are front and rear views of a PCB, consistent with the present disclosure.
Figure 10:
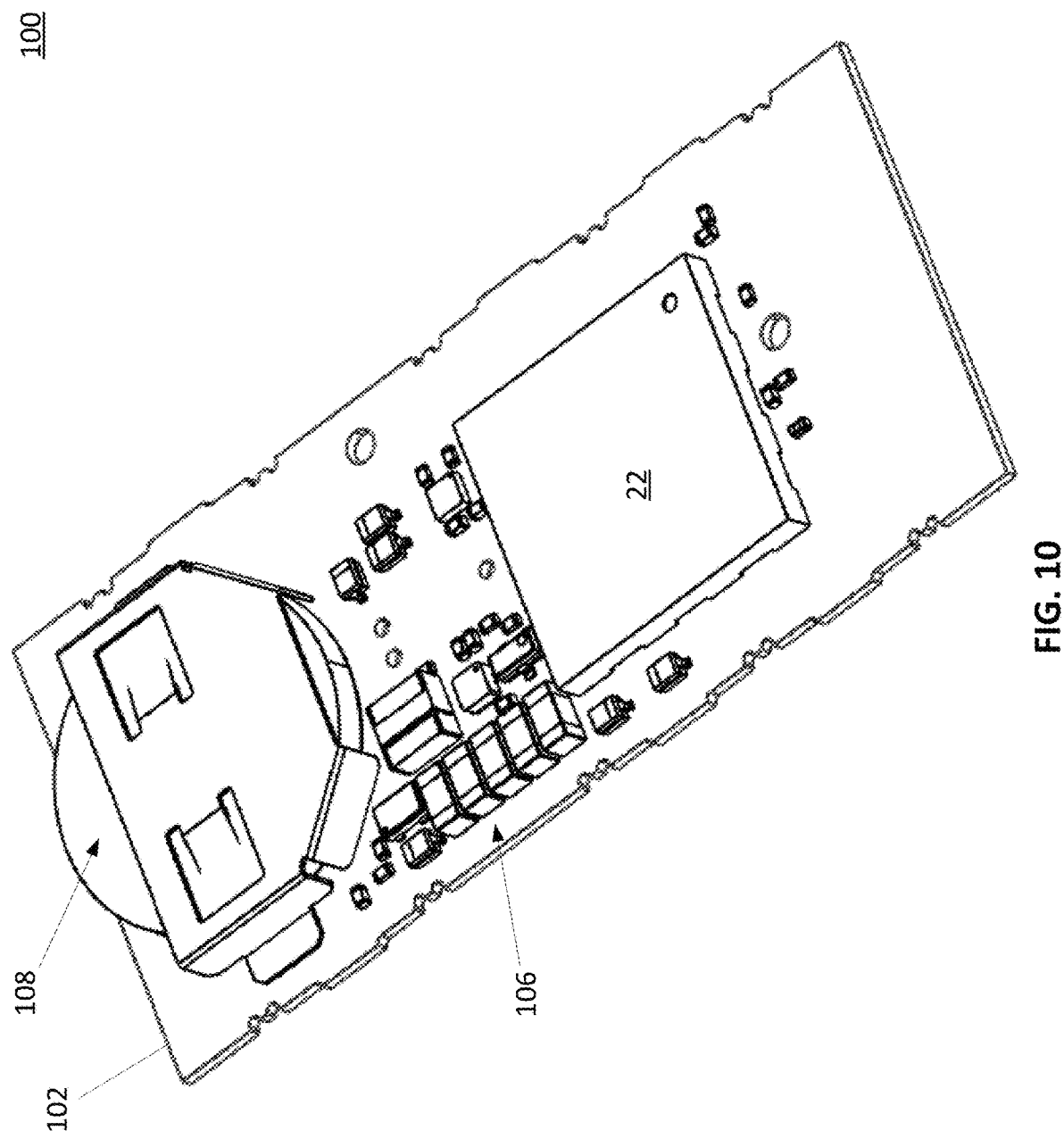

Turning now to FIG. 8, an exploded view of one example of a wireless remote controller 12 consistent with FIG. 1 is generally illustrated. The wireless remote controller 12 may include a housing 18, one or more buttons 20, and a printed circuit board (PCB) 100. The PCB 100 (see, e.g., FIGS. 9-10) may include a support board 102 for mechanically supporting and/or electrically connecting various components (e.g., circuitry). The electrical components may include, but is not limited to, one or more switches 104 configured to be actuated by the one or more buttons 20, as well as one or more controllers (control circuitry) 106 configured to receive an input signal from the switches 104 and generate a command signal (for controlling one or more parameters of the electronic device 16 as discussed herein), a power supply 108 (e.g., one or more batteries) for providing power to the wireless remote controller 12, and communication circuitry 22 for transmitting the command signal and/or receiving wireless signals 14 as discussed herein. The switches 104 may include any known type of switch such as, but not limited to, tactile switches (e.g., popple dome switches), optical switches, pressure switches, capacitive switches, or the like. In at least one example, the switch 104 may be configured to generate a biasing force that urges the button 20 towards the default position (i.e., non-actuated position).

Figure 11:
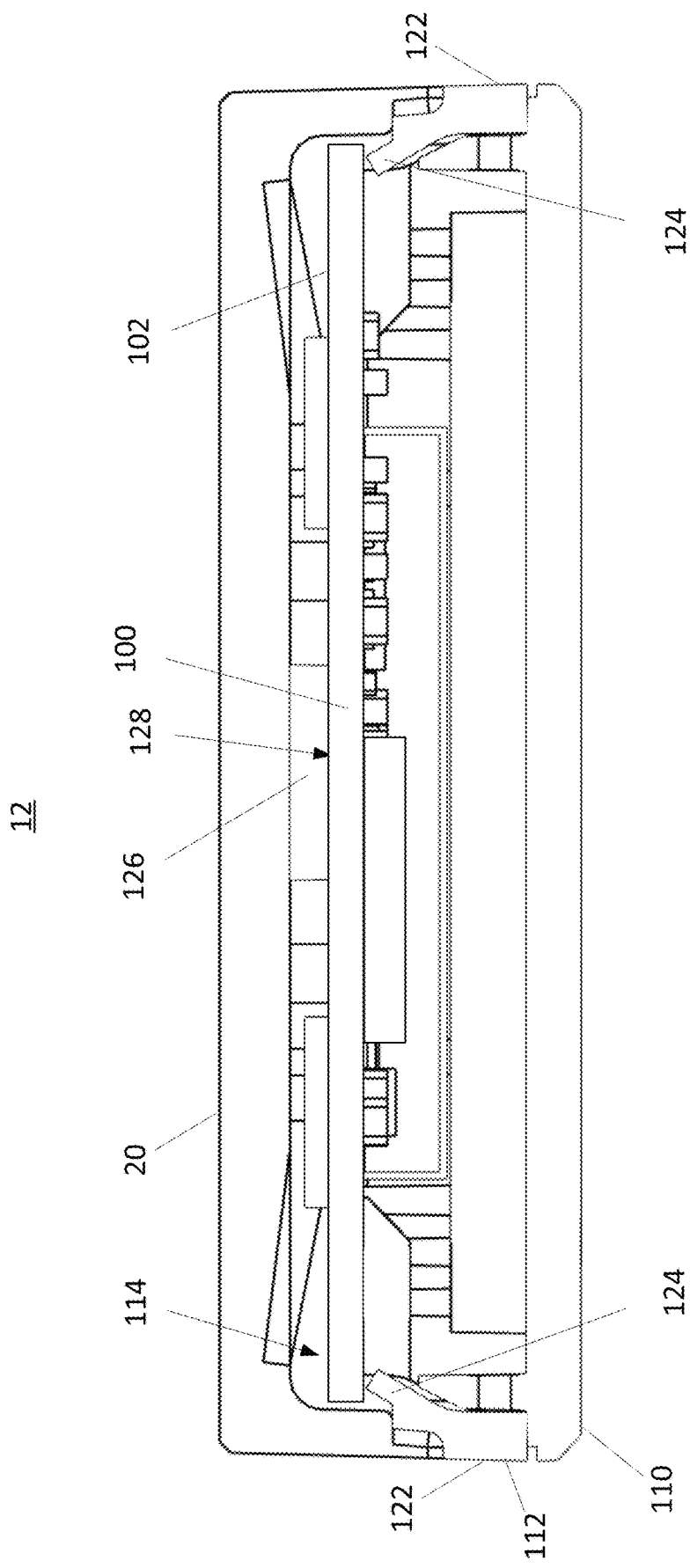
FIG. 11 is a cross-sectional view of showing the PCB secured within the PCB cavity, consistent with the present disclosure.
Figure 12:
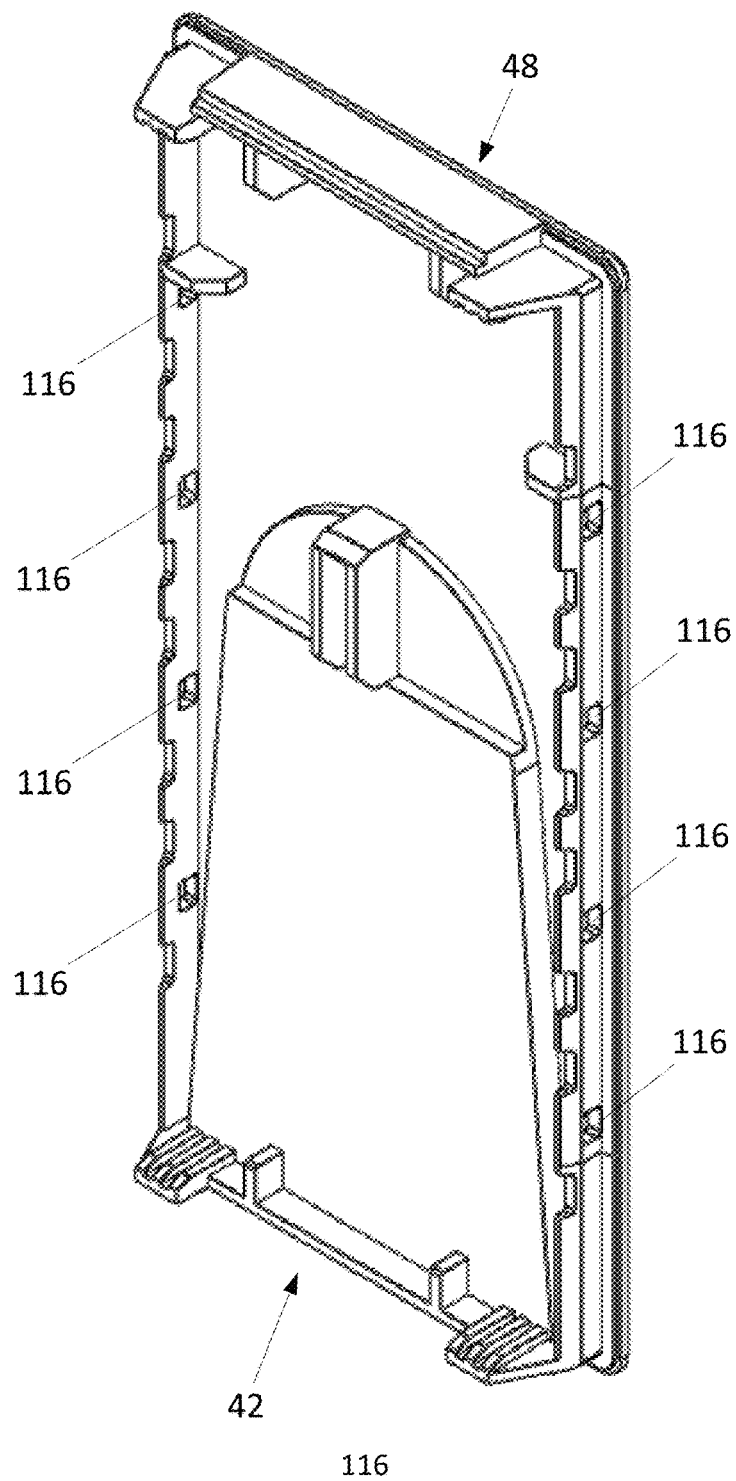
FIGS. 12 and 13 are internal and external views of a rear enclosure, consistent with the present disclosure.
Figure 13:
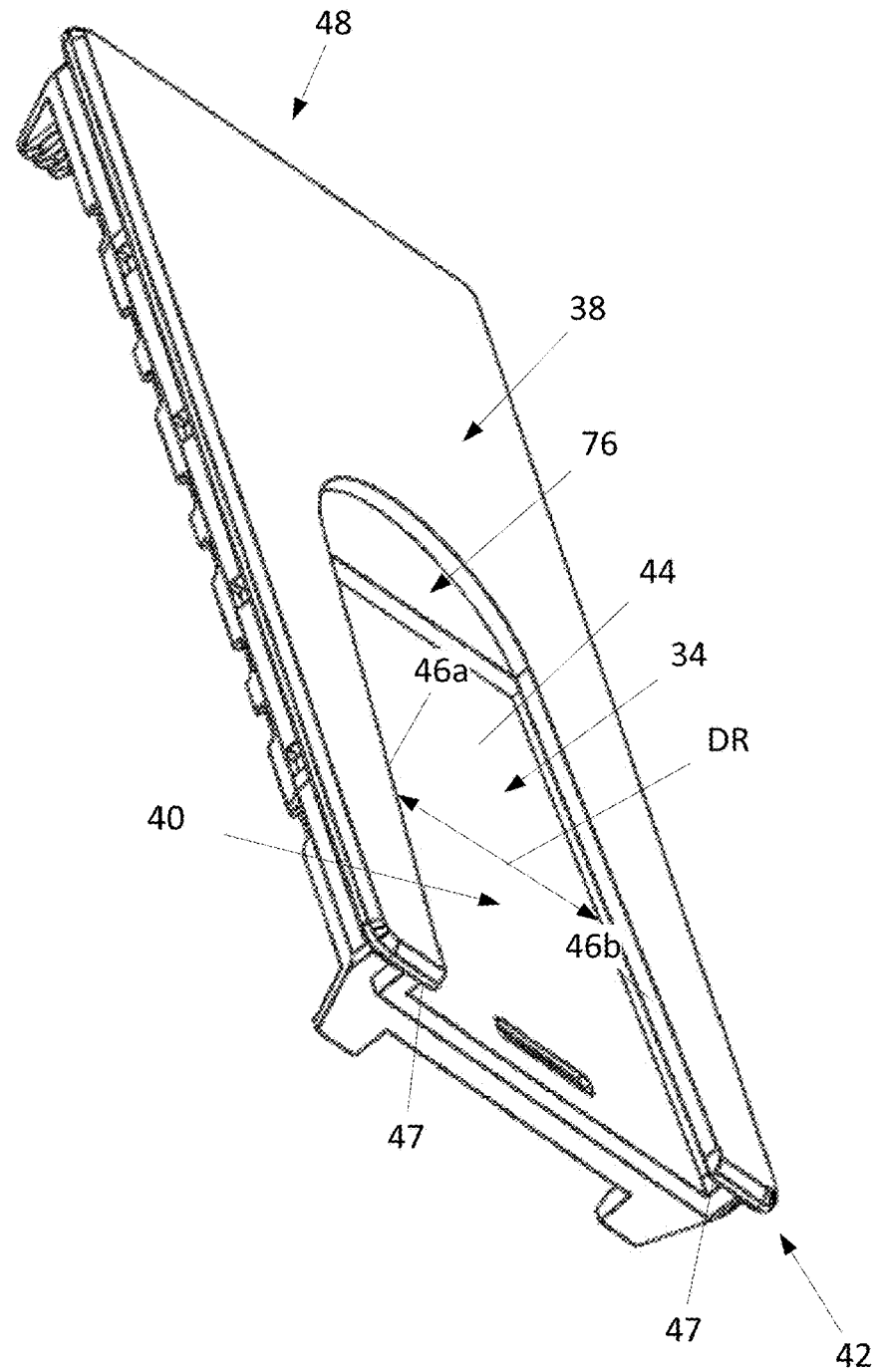

With reference back FIG. 8, the housing 18 includes a rear enclosure 110 and a front enclosure 112 that, when assembled together (e.g., as shown in the cross-sectional view of FIG. 11), at least partially defines one or more PCB cavities 114 configured to at least partially receive the PCB 100. Turning to FIGS. 12-13, an interior and exterior perspective view of the rear enclosure 110 is generally illustrated. The rear enclosure 110 may be configured to be secured to the front enclosure 112 in any manner known to those skilled in the art. In at least one embodiment, the rear enclosure 110 may be configured to be removably secured to the front enclosure 112. For example, the rear enclosure 110 may include one or more cavities or notches 116 configured to receive one or more corresponding resiliently deformable tabs or snaps 118 (see, e.g., FIG. 15) formed by the front enclosure 112. Of course, the arrangement of the snaps 116 and notches 118 may be reversed. The rear enclosure 110 may also define at least a portion of the rear surface 38 of the housing 18 (which may include the mounting cavity 34) and optionally at least a portion of one or more exterior sidewalls of the housing 18.

Figure 14:
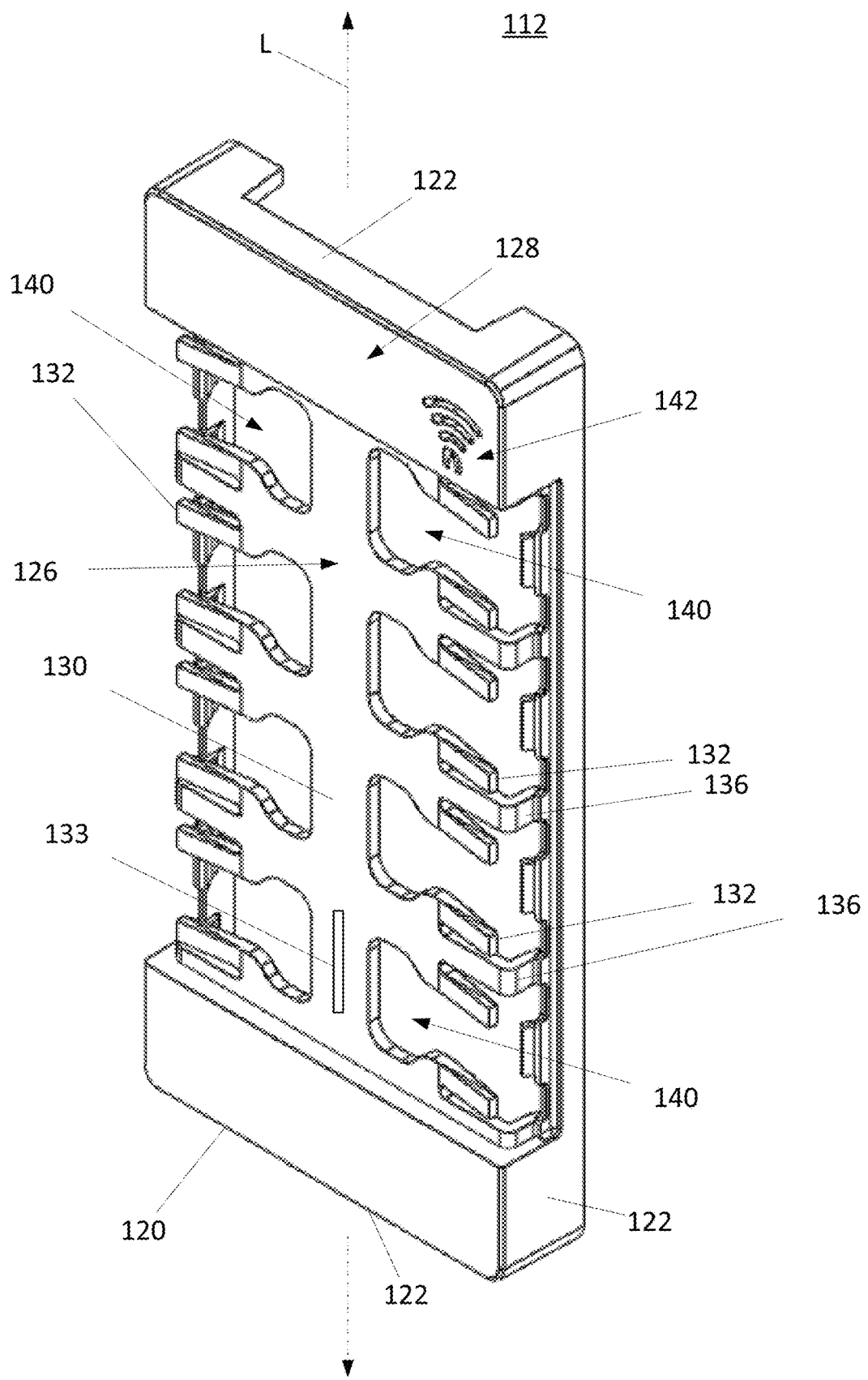
FIGS. 14 and 15 are internal and external views of a front enclosure, consistent with the present disclosure.
Figure 15:
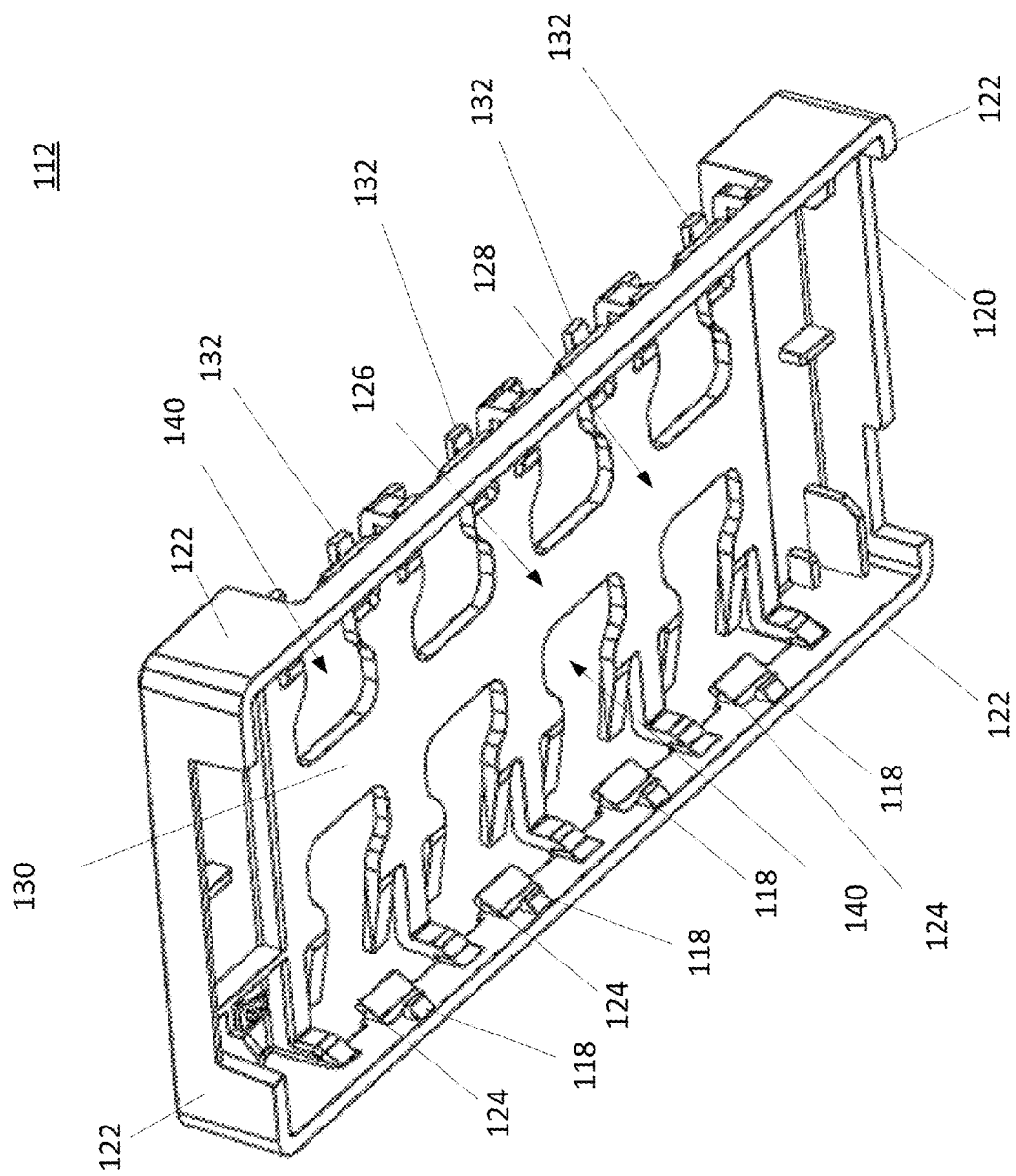

Turning to FIGS. 14-15, an exterior and interior perspective view of the front enclosure 112 is generally illustrated. As can be seen, the front enclosure 112 includes a body 120 having one or more sidewalls 122, one or more PCB retainers 124, and one or more button support frames 126. The sidewalls 122 may extend around all or a portion of the periphery of the front enclosure 112. In the illustrated example, the body 120 has a generally rectangular shape and includes a top sidewall 122, a bottom sidewall 122 generally opposite the top sidewall 122, as well as left and right sidewalls 122 generally opposite each other, though it should be appreciated body 120 may have any shape known to those skilled in the art. The body 120 may also optionally define at least a portion of the front surface 128 of the housing 18 and/or at least a portion of one or more exterior sidewalls of the housing 18. One or more of the sidewalls 122 may optionally include the resiliently deformable tabs or snaps 118 and/or cavities or notches 116 configured to removably secure the front enclosure 112 to the rear enclosure 110.

The PCB retainers 124 (best seen in FIGS. 11 and 15) may be configured to secure the PCB 100 to the front enclosure 112. In the illustrated example, the PCB retainers 124 may be disposed along and extend inwardly from an internal surface of the sidewall 122, though it should be appreciated that the PCB retainers 124 may extend from any portion of the body 120. The PCB retainers 124 may include a resiliently deformable tab configured to bend out of the way and snap back into engagement with the support board 102 of the PCB 100. The PCB retainers 124 may generally confine and/or bias the PCB 100 against a portion of the body 120 (e.g., an internal surface 128 of the more button support frames 126) such that the PCB 100 is generally locked in place relative to the front enclosure 112.

The one or more button support frames 126 may be configured to bias and/or support the buttons 20. For example, the button support frames 126 may include one or more rocker supports 130 and one or more fingers 132. The rocker support 130 may extend along (e.g., generally parallel to) a longitudinal axis L of the housing 18 and/or front enclosure 112. In the illustrated example, the rocker supports 130 may extend generally between the top 48 and bottom 42 of the housing 18. Alternatively (or additionally), one or more of the rocker supports 130 may extend transverse (e.g., generally perpendicular to) the longitudinal axis L.

The rocker support 130 may be configured to generally limit inward movement of the buttons 20 when the buttons 20 are depressed into the housing 18. In particular, as the user depresses the button 20 into the housing 18, the interior surface of the button 20 may contact the rocker support 130 to thereby limit inward movement of the button 20 (e.g., to prevent damage to the switches 104). Alternatively (or additionally), the rocker support 130 may be configured to act as a backbone and/or fulcrum point for the button 20. As discussed herein, one or more of the buttons 20 may include two or more button portions and may be configured to move (e.g., rock) side to side such that a single button 20 may activate two or more switches 104 (e.g., where one or more switch 104 corresponds to each button portion). The button 20 may include a fulcrum on an interior surface thereof that contacts the rocker support 130 to allow the button 20 to rock. Alternatively (or additionally), the rocker support 130 may include a fulcrum 133 that extends outwardly therefrom that is configured to contact the interior surface of the button 20 to allow the button 20 to deflect side to side and/or rock. In at least one example, applying a force to only one of the button portions 206 (by way of example, a left button portion 260) causes that button portion 260 (e.g., the left button portion 260) to move inwardly towards its associated switch 104 while the button portion 206 on the opposite side (e.g., the unactuated or right button portion 260) remains substantially stationary (e.g., does not substantially move inwardly toward its associated switch 104 and/or outwardly away from its associated switch 104). Put another way, the fulcrum may be configured to allow only one side of the button 20 (e.g., the actuated button portion 206) to deflect inwardly towards the switch 104 while allowing the other (opposite) side of the button 20 (e.g., the unactuated button portion 206) to not rise. It should be appreciated that the outer most and inward most end regions of the unactuated button portion 206 (e.g., the right button portion 206 in this example) may move slightly.

The one or more fingers 132 may be configured to bias the buttons 20 toward the default position (i.e., the position when not actuated by a user). The fingers 132 may contact the interior surface of the buttons 20 and generate a return force that pushes the buttons outwardly. In one embodiment, the fingers 132 may generate all or substantially all of the return force that biases the buttons 20 toward the default position. Alternatively, the fingers 132 may provide a supplementary return force that is in addition to a return force generated by the switches 104. In either case, the fingers 132 may optionally align the buttons 20. For example, the fingers 132 may be configured to align all the buttons 20 to be generally level or flush with each other and/or generally level or flush with the front surface 128 of the housing 18.

In at least one example, one or more of the fingers 132 may extend from and/or be supported by a portion of the rocker support 130. Alternatively (or additionally), one or more of the fingers 132 may extend from and/or be supported by a portion 136 of the sidewall 122. In the illustrated embodiment, two fingers 132 contact a left side of the button 20 and two fingers 132 contact a right side of the button; however, the number of fingers 132 that urge the button 20 may vary depending on the size and shape of the button.

Figure 16:
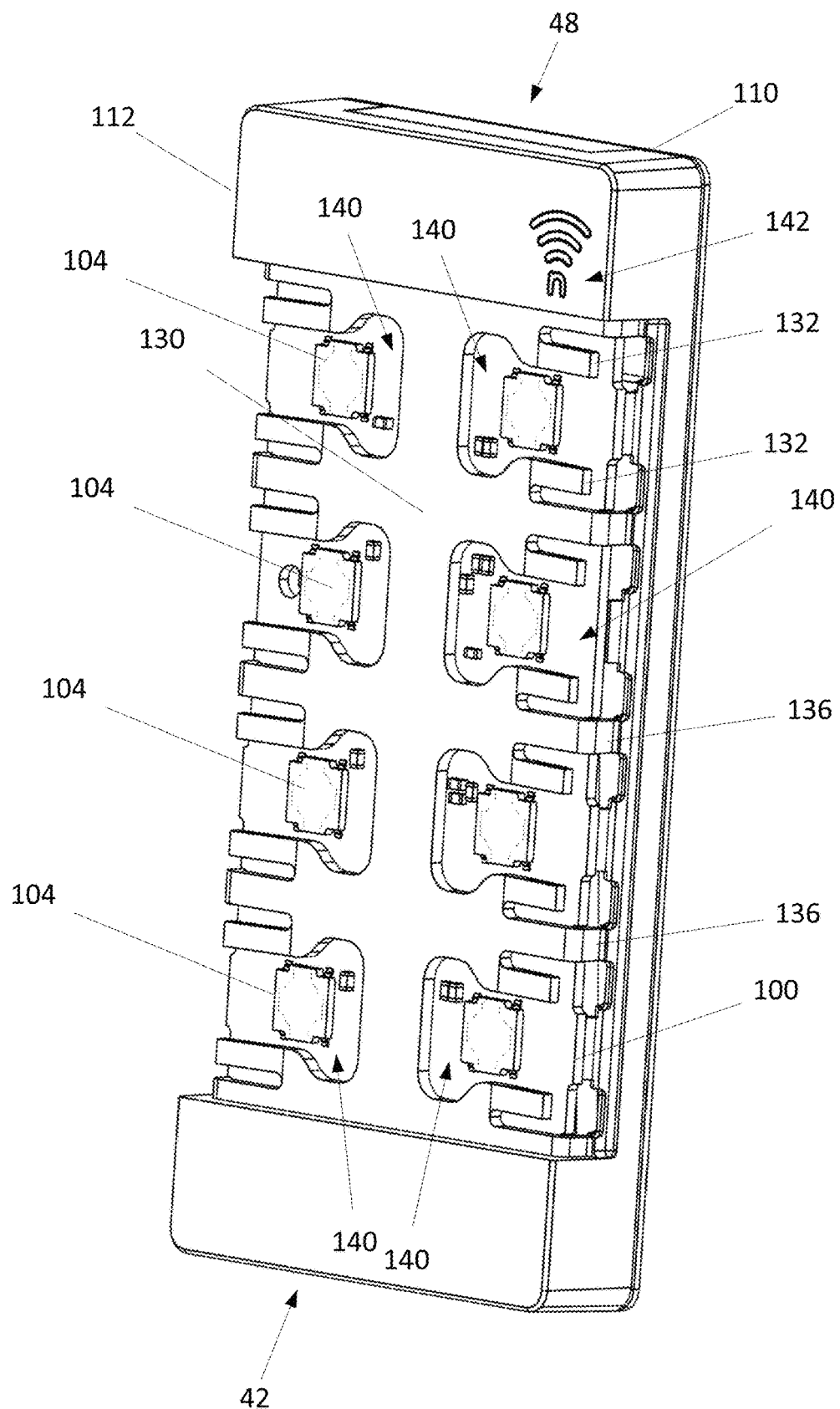
FIG. 16 is a partial view of showing the PCB secured within the PCB cavity without the buttons.
Figure 17A:
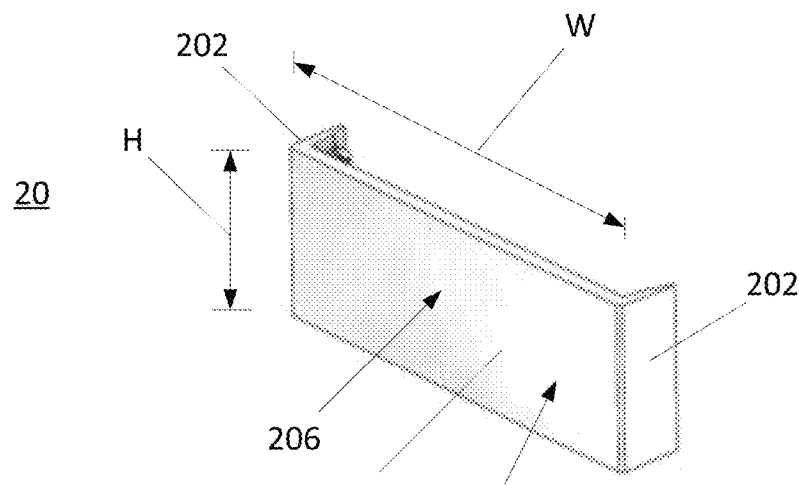
FIGS. 17A-C shows a button body having an exterior surface defining a single button portion configured to extend across the entire width W and height H of the button body, consistent with the present disclosure.
Figure 17B:
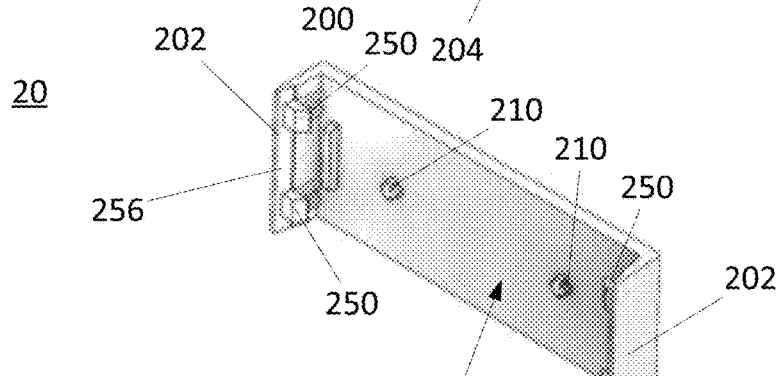
Figure 17C:
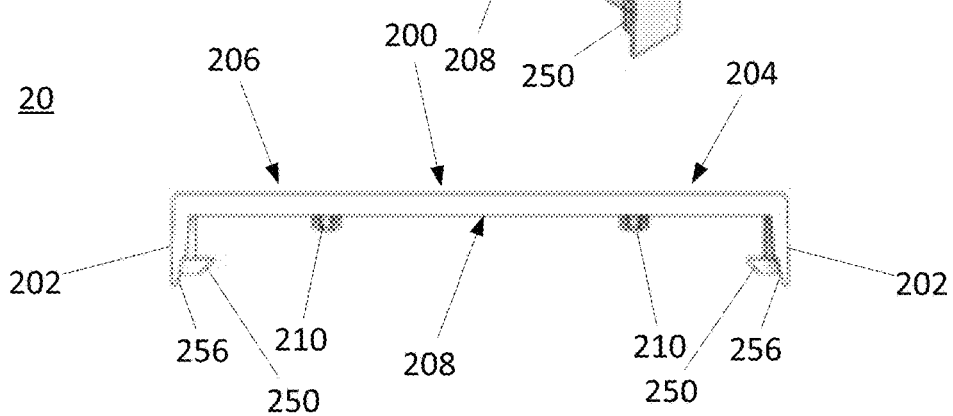
Figure 18A:
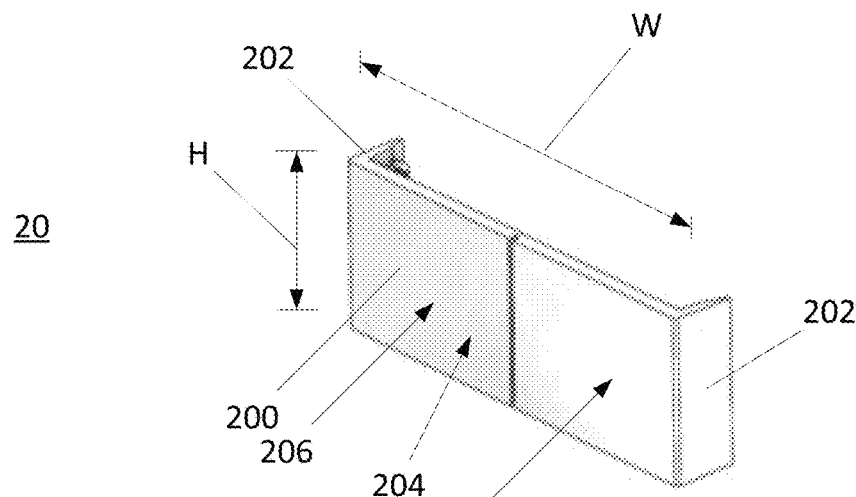
FIG. 18A-C shows the button body having an exterior surface defining two button portions which are configured to collectively extend across the entire width W and height H of the button body, consistent with the present disclosure.
Figure 18B:
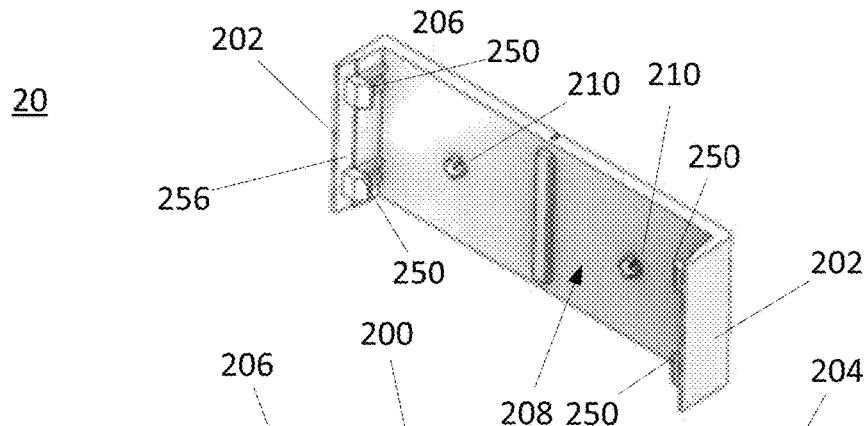
Figure 18C:
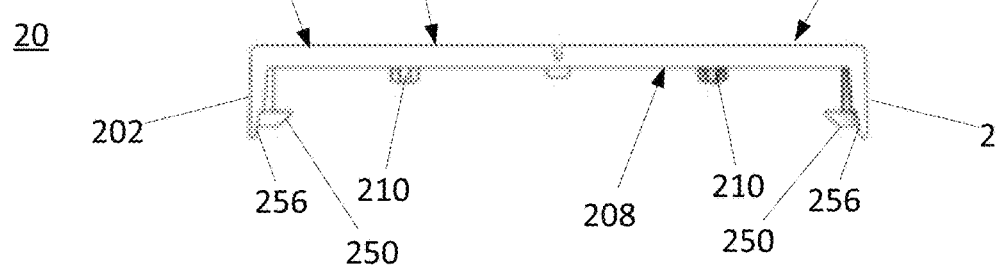

The button support frame 126 may optionally include one or more button apertures 140. With reference to FIG. 16 (in which the buttons 20 are not shown), the button apertures 140 may be configured to allow a portion of the button 20 and/or the switch 104 to extend through the button support frame 126 and allow contact between the button 20 and the switch 104 when the button 20 is depressed. As can be seen in FIG. 16, each switch 104 may be associated with two fingers 132 (e.g., one finger 132 generally above and one finger generally below the switch 104).

The front enclosure 112 may optionally include one or more indicia 142. The indicia 142 may be configured to provide a visual confirmation to the user upon activation of a button 20. The indicia 142 may also be configured to provide a visual indication to the user when the batteries need to be replaced and/or that the wireless remote controller 12 is connected (e.g., paired) to the communication circuitry 124 associated with the electronic device 16.

Figure 19A:
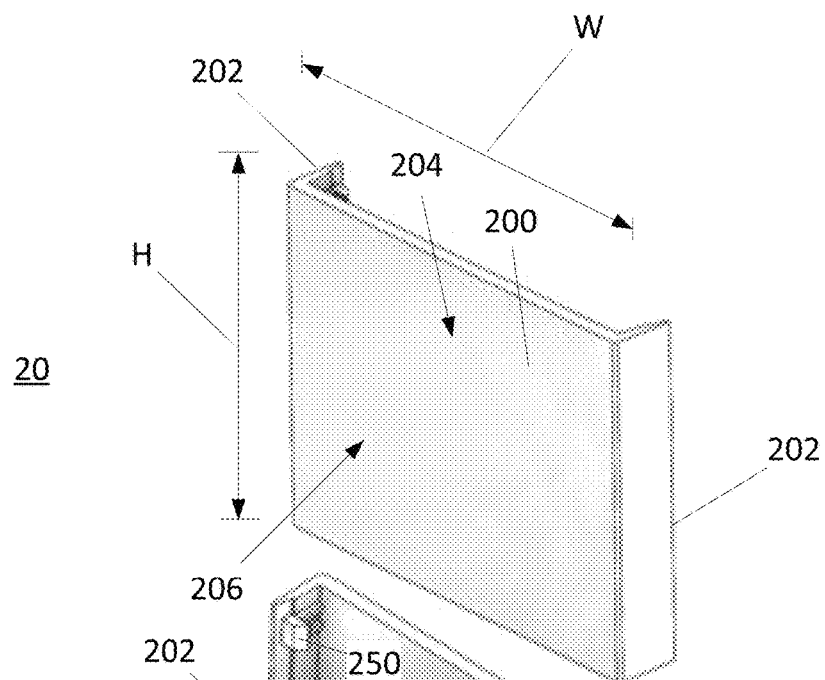
FIG. 19A-C shows the button body having an exterior surface defining a single button portion which is configured to extend across the entire width W and height H of the button body and across multiple vertically offset switches, consistent with the present disclosure.
Figure 19B:
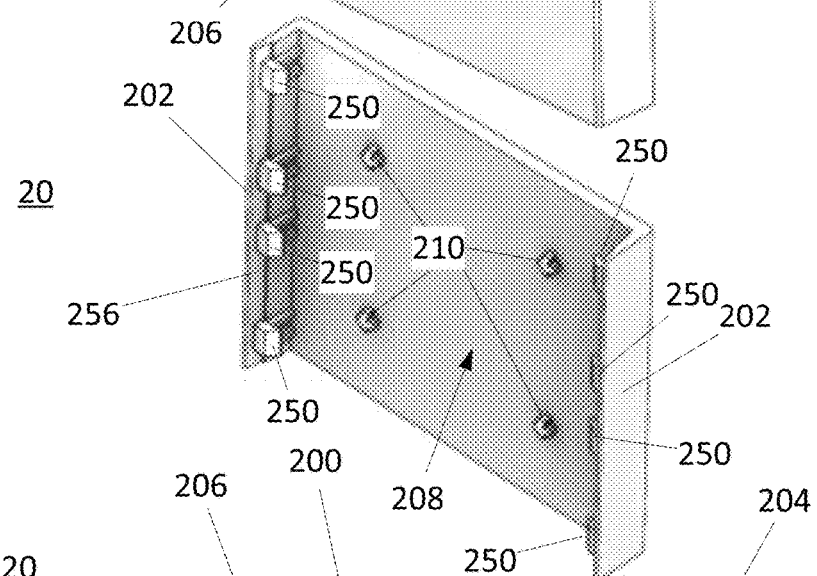
Figure 19C:
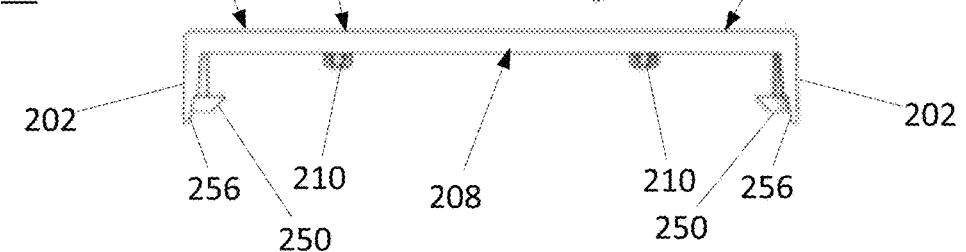

Turning now to FIGS. 17A-19C, various examples of buttons 20 consistent with the present disclosure are generally illustrated. As noted herein, the number and size of the buttons 20 may vary depending on the intended application. The button 20 may include a button body 200 and two or more button sidewalls 202 extending from opposite sides of the button body 200. The button body 200 may include an exterior surface 204 defining one or more button portions 206 and an interior surface 208 configured to actuate one or more switches 104. As used herein, the term "button portion 206" is intended to refer to a region of the button body 200 that the user may depress in order to actuate a switch. The button portion 206 may optionally include indicia, for example, which represents a function to be controlled upon actuation of the button portion 260. For example, the button body 200 in FIGS. 17A-C may include an exterior surface 204 defining a single button portion 206 configured to extend across the entire width W and height H of the button body 200. Referring to FIG. 18A-C, the button body 200 may include an exterior surface 204 defining a two button portions 206 which are configured to collectively extend across the entire width W and height H of the button body 200. Referring to FIG. 19A-C, the button body 200 may include an exterior surface 204 defining a single button portion 206 which is configured to extend across the entire width W and height H of the button body 200 and across multiple vertically offset switches 104. Notably, in all the examples shown, the width W of the button body 200 may be substantially the same as the width of the wireless remote controller 12 (e.g., the same as the width of the housing 18). As a result, the size (e.g., the width) of the button 20 relative to the size (e.g., the width) of the wireless remote controller 12/housing 18 may be maximized.

The interior surface 208 of the button body 200 may include one or more button actuators 210. The button actuators 210 may include a protrusion or the like extending outwardly from the interior surface 208 of the button body 200 configured to engage (e.g., contact) the switch 104. In embodiments where the button body 200 includes only a single button portion 206 (see, e.g., FIGS. 17A-C and 19A-C), the button body 200 may include only a single button actuator 210 configured to contact a single switch 104. It should be appreciated; however, that the button body 200 may include multiple actuators 210 configured to contact multiple switches 104 even in embodiments where the button body 200 includes only a single button portion 206. The number and placement of the button actuators 210 may depend on the intended application.

In embodiments where the button body 200 includes two or more button portions 206 (see, e.g., FIGS. 18A-C), the button body 200 may include one or more button actuators 210 associated with each button portion 206 such that the button 20 may selectively contact a two or more switches 104. As noted herein, the button body 200 may be configured to rock left/right upon depressing the left or right button portion 206 in order to actuate a first and a second switch 104. In at least one example, the interior surface 208 of the button body 200 may include a fulcrum 212. The fulcrum 212 may include a raised protrusion extending outwardly from the interior surface 208. The fulcrum 212 may be located on the interior surface 208 between the left and right button portions 206. The fulcrum 212 may be configured to engage (e.g., contact) the rocker support 130 of the button support frames 126. Alternatively (or additionally), the fulcrum 133 associated with the rocker support 130 may be configured to engage (e.g., contact) the interior surface 208 of the button body 200 between the left and right button portions 206.

Figure 20:
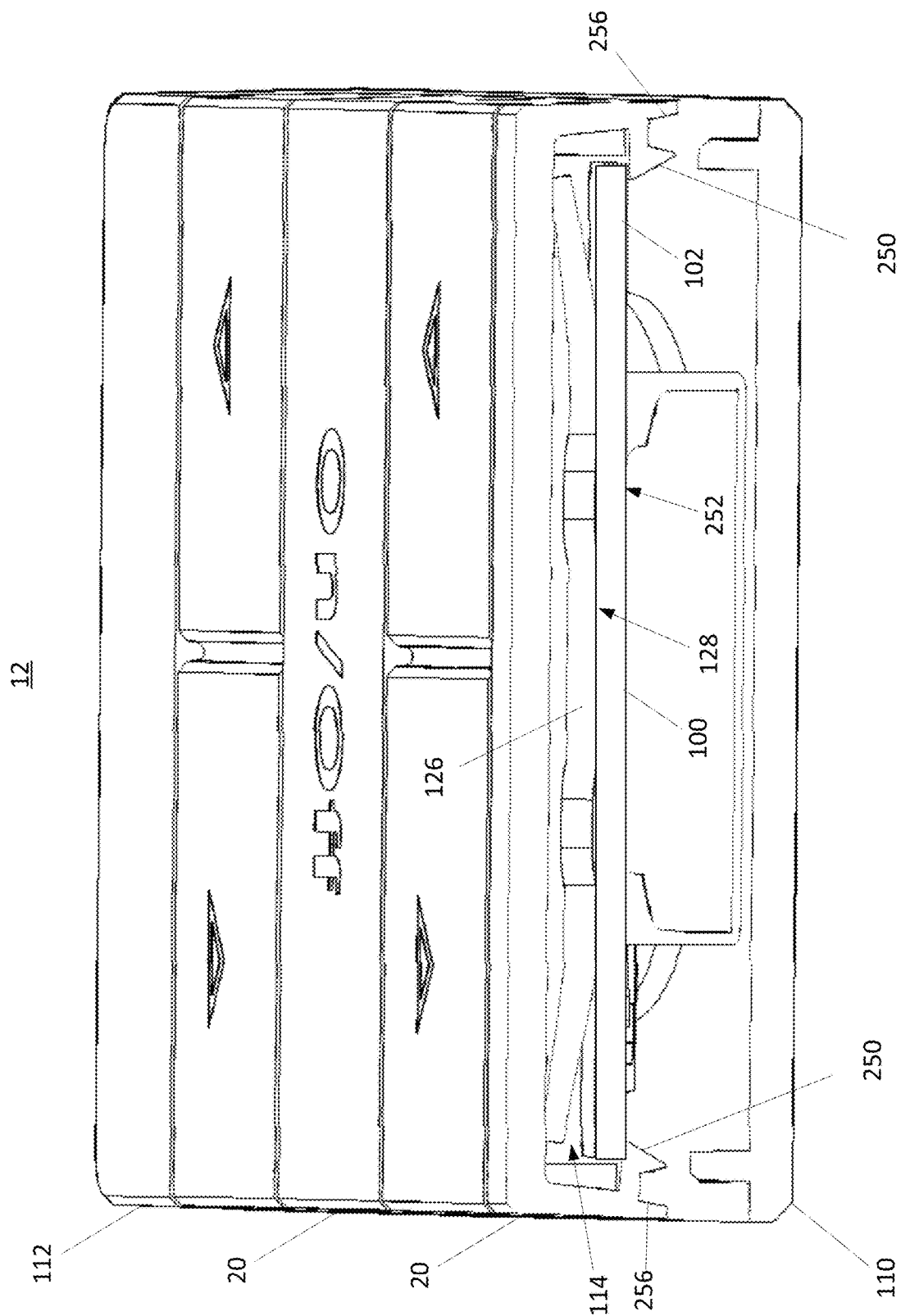
FIG. 20 is a cross-sectional view showing one example of the retaining fingers.

The button 20 may be configured to be secured to the PCB 100. For example, each sidewall 202 may include one or more retaining fingers 250. The retaining fingers 250 may include a resiliently deformable tab defining a notch configured to receive and engage backside 252 of the support board 102 of the PCB 100 (i.e., the side of the support board 102 that is generally opposite to the buttons 20) as generally illustrated FIG. 20. The retaining fingers 250 allow the button 20 to move inwardly towards the switch 104 but prevent the button 20 from becoming disconnected from the PCB 100 (and therefore from the housing 18). The sidewalls 202 may include a tapered or chamfered interior surface 256 configured to allow the button 20 to rock left and right (e.g., allow sufficient clearance between the sidewalls 202 and the PCB 200 and/or housing 18 when rocking).

Figure 21:
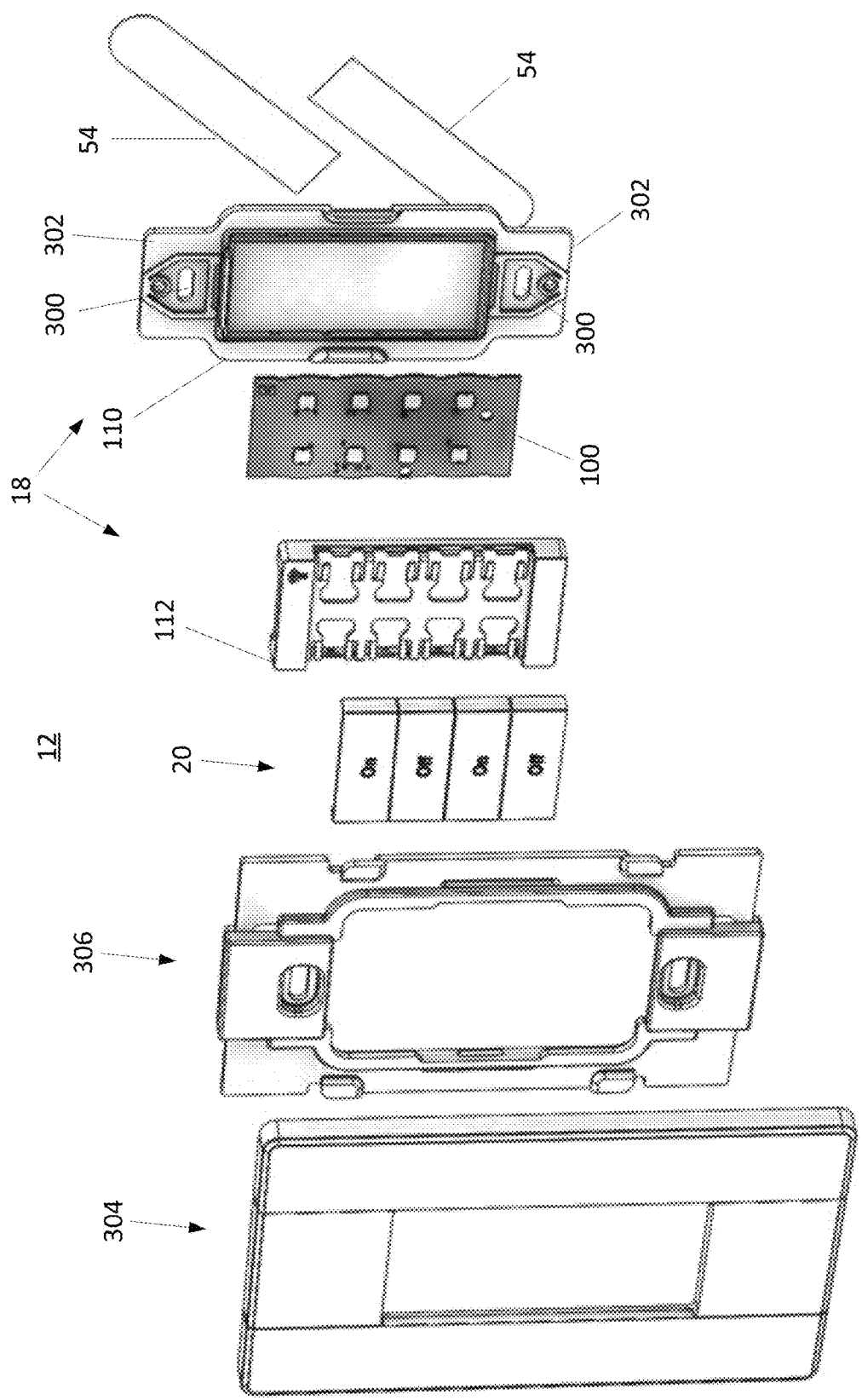
FIG. 21 generally illustrates an exploded view of the wireless remote controller, consistent with the present disclosure.
Figure 22:
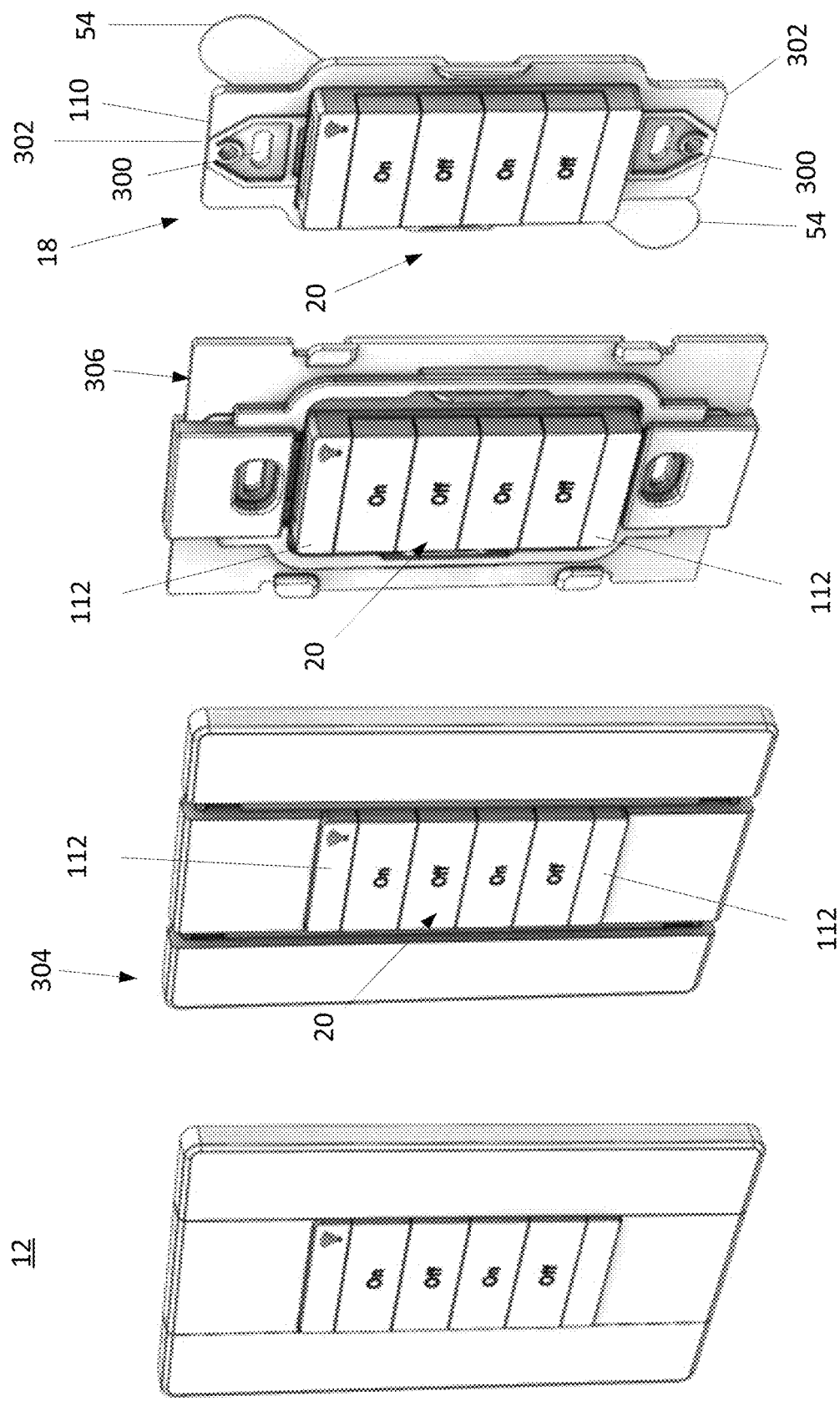
FIG. 22 generally illustrates various assemble states of the wireless remote controller, consistent with the present disclosure.
Figure 23:
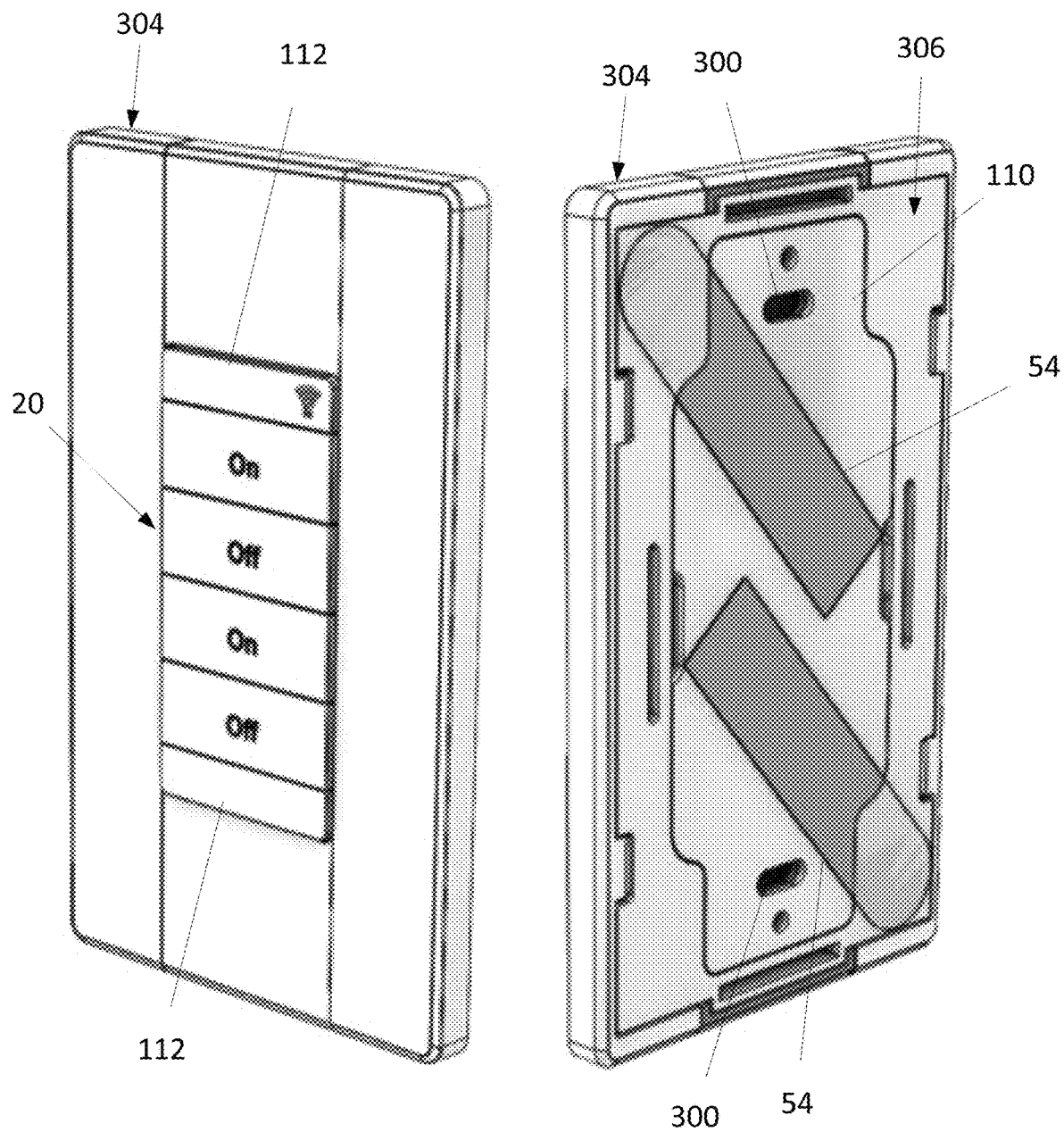
FIG. 23 generally illustrates a front and rear view of the assembled wireless remote controller, consistent with the present disclosure.

Turning now to FIGS. 21-23, another embodiment of a wireless remote controller 12 consistent with the present disclosure is generally illustrated. In particular, FIG. 21 generally illustrates an exploded view of the wireless remote controller 12, FIG. 22 generally illustrates various assemble states of the wireless remote controller 12, and FIG. 23 generally illustrates a front and rear view of the assembled wireless remote controller 12. The wireless remote controller 12 may be configured to be secured directed to a support surface (e.g., a wall) and/or to a junction box. The wireless remote controller 12 may be similar to the wireless remote controller 12 described previously, and as such, the following will focus primarily on the differences for the sake of brevity.

The wireless remote controller 12 includes a housing 18 comprising a rear enclosure 110 and a front enclosure 112, a PCB 100 configured to be received within the housing 18, and one or more buttons 20. The rear enclosure 110 may include one or more mounting apertures 300 configured to secure the housing 18 to a support surface or standard electrical junction box. The mounting apertures 300 may be formed in mounting flanges 302 which extend from the top and bottom ends of the rear enclosure 110. Alternatively (or additionally), the housing 18 may be secured to the support surface using double sided tape 54.

The front enclosure 112 may be sized and shaped to fit within a standard decor opening of an electrical box cover plate 304. The wireless remote controller 12 may optionally include a cover plate mount 306. The cover plate mount 306 may be configured to allow an electrical box cover plate 304 to be secured to the wireless remote controller 12. In at least one example, the electrical box cover plate 304 may include multiple pieces that are configured to slidably engage and be secured to the cover plate mount 306 such that the exterior surface of the wireless remote controller 12 does not have any visible fasteners (e.g., screws or bolts). On example of a multiple piece electrical box cover plate 304 and cover plate mount 306 is described in U.S. Pat. No. 9,800,034 entitled WALL PLATE SYSTEM, which is fully incorporated herein by reference.

As used in any implementation herein, the terms "circuit" and "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware implementations of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other implementations may be implemented as software executed by a programmable control device.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "substantially" or the like is intended to mean within 10% of an absolute value.

What is claimed:

1. A wireless remote controller comprising:
a housing including a front enclosure and a rear enclosure defining a printed circuit board (PCB) cavity;
a PCB configured to be disposed at least partially within the PCB cavity, the PCB including a support board, one or more switches configured to generate a command upon actuation, and communication circuitry configured to generate a wireless signal representative of the command; and
a button configured to actuate the switch upon depressing the button inwardly towards the PCB, the button including a button body having at least one button portion and a first and a second button sidewall extending from the button body;
wherein a width of the button is substantially the same as a width of the housing; and
wherein each button sidewall includes one or more retaining fingers configured to receive and engage a backside of the support board of the PCB.

2. The wireless remote controller of claim 1, wherein the at least one switch includes a first and a second switch and the at least one button portion includes a first and a second button portion configured to engage the first and second switch, respectively.

3. The wireless remote controller of claim 2, wherein an interior surface of the button includes a fulcrum configured to engage the housing and allow the button to deflect on only one side to actuate the first and second switch.

4. The wireless remote controller of claim 3, wherein the fulcrum includes a protrusion extending away from the interior surface of the button configured to engage the front enclosure.

5. The wireless remote controller of claim 2, wherein the first and second button sidewall each include a chamfered interior surface configured to allow the button to rock left and right to actuate the first and second switch.

6. The wireless remote controller of claim 2, wherein the front enclosure includes a fulcrum configured to engage an interior surface of the button to allow the button to rock left and right to actuate the first and second switch.

7. The wireless remote controller of claim 1, wherein the front enclosure includes a button support frame configured to bias the button to an unactuated position.

8. The wireless remote controller of claim 7, wherein the button support frame includes one or more rocker supports and one or more fingers.

9. A wireless remote controller comprising:
a housing including a front enclosure and a rear enclosure defining a printed circuit board (PCB) cavity;
a PCB configured to be disposed at least partially within the PCB cavity, the PCB including a support board, one or more switches configured to generate a command upon actuation, and communication circuitry configured to generate a wireless signal representative of the command; and
a button configured to actuate the switch upon depressing the button inwardly towards the PCB, the button including a button body having at least one button portion and a first and a second button sidewall extending from the button body;
wherein a width of the button is substantially the same as a width of the housing, the front enclosure includes a button support frame configured to bias the button to an unactuated position, the button support frame including one or more rocker supports and one or more fingers.

10. The wireless remote controller of claim 9, wherein the rocker support extends along a longitudinal axis of the housing.

11. The wireless remote controller of claim 10, wherein the rocker support is configured to generally limit inward movement of the buttons when the button is depressed into the housing.

12. The wireless remote controller of claim 9, wherein the one or more fingers are configured to bias the button towards a default position.

13. The wireless remote controller of claim 9, wherein the one or more fingers are configured to align the button to be generally level or flush with a front surface of the housing.

14. The wireless remote controller of claim 9, wherein the button includes a first and a second button and wherein the one or more fingers are configured to align the first and second buttons to be generally level or flush with each other.

15. The wireless remote controller of claim 9, wherein the button support frame includes one or more button apertures configured to allow a portion of the button and/or the switch to extend through the button support frame and allow contact between the button and the switch when the button is depressed.

16. A wireless control system comprising:
a wireless remote controller comprising:
    a housing including a printed circuit board (PCB) cavity and a mounting cavity formed in at least a portion of a rear surface of the housing, the mounting cavity having an opening, a base, and a first and a second converging cavity sidewall extending from the base;
    a PCB configured to be disposed at least partially within the PCB cavity, the PCB including a support board, one or more switches configured to generate a command upon actuation, and communication circuitry configured to generate a wireless signal representative of the command; and
    a button configured to actuate the switch upon depressing the button inwardly towards the PCB; and
a mounting plate configured to removably secure the wireless remote controller to a support surface, the mounting plate including a first and second converging mount sidewalls each including a rail;
wherein the first and second cavity sidewalls and the first and second mount sidewalls include a first and a second rail and a first and a second channel;
wherein the convergence of the first and second mount sidewalls corresponds to the convergence of the first and second cavity sidewalls such that the first and second rails slidably fit within and engage the first and second channels to retain the wireless remote controller to the mounting plate; and
wherein the mounting cavity and the mounting plate further comprise a mounting detent and a mounting recess configured to provide audible noise or tactile feedback when the wireless remote controller is secured to the mounting plate.

17. The wireless control system of claim 16, wherein the first and second mount sidewalls of the mounting plate have a generally trapezoidal shape which corresponds to a generally trapezoidal shape of the first and second converging cavity sidewalls of the mounting cavity.

18. The wireless control system of claim 16, wherein a separation distance of the opening proximate a bottom of the housing is larger than the separation distance proximate a top of the housing.

19. The wireless control system of claim 16, wherein the includes a button body having at least one button portion and a first and a second button sidewall extending from the button body, wherein each button sidewall includes one or more retaining fingers configured to receive and engage a backside of the support board of the PCB.

20. The wireless control system of claim 16, wherein the housing includes a front enclosure and a rear enclosure defining the PCB cavity, the front enclosure including a button support frame configured to bias the button to an unactuated position, the button support frame including one or more rocker supports and one or more fingers.

* * * * *